(12) United States Patent
Kim et al.

(10) Patent No.: US 12,094,974 B2
(45) Date of Patent: Sep. 17, 2024

(54) SEMICONDUCTOR DEVICES AND METHOD OF FABRICATING THE SAME

(71) Applicant: Samsung Electronics Co., Ltd., Suwon-si (KR)

(72) Inventors: Jaemun Kim, Seoul (KR); Dahye Kim, Seoul (KR); Jinbum Kim, Seoul (KR); Gyeom Kim, Hwaseong-si (KR); Dohee Kim, Seoul (KR); Dongwoo Kim, Incheon (KR); Seunghun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/307,279

(22) Filed: Apr. 26, 2023

(65) Prior Publication Data

US 2023/0268441 A1 Aug. 24, 2023

Related U.S. Application Data

(63) Continuation of application No. 17/192,301, filed on Mar. 4, 2021, now Pat. No. 11,664,453.

(30) Foreign Application Priority Data

Jul. 3, 2020 (KR) ........................ 10-2020-0082374

(51) Int. Cl.
*H01L 29/78* (2006.01)
*H01L 21/8234* (2006.01)
(Continued)

(52) U.S. Cl.
CPC .... *H01L 29/785* (2013.01); *H01L 21/823431* (2013.01); *H01L 29/41791* (2013.01);
(Continued)

(58) Field of Classification Search
CPC .......... H01L 29/785; H01L 21/823431; H01L 29/41791; H01L 29/6681; H01L 29/66818;
(Continued)

(56) References Cited

U.S. PATENT DOCUMENTS 7,183,175 B2    2/2007   Koester et al.
9,755,017 B1    9/2017   Guillorn et al.
(Continued)

FOREIGN PATENT DOCUMENTS

KR    10-2007-0024788 A    3/2007

OTHER PUBLICATIONS

Non-Final Office Action issued Sep. 2, 2022 in U.S. Appl. No. 17/192,301.

(Continued)

*Primary Examiner* — Cuong B Nguyen
(74) *Attorney, Agent, or Firm* — Harness, Dickey & Pierce, P.L.C.

(57) ABSTRACT

A semiconductor device includes a substrate including a fin-type active region, the fin-type active region extending in a first direction; a plurality of channel layers on the fin-type active region, the plurality of channel layers including an uppermost channel layer, a lowermost channel layer, and an intermediate channel layer isolated from direct contact with each other in a direction perpendicular to an upper surface of the substrate; a gate electrode surrounding the plurality of channel layers and extending in a second direction intersecting the first direction; a gate insulating film between the plurality of channel layers and the gate electrode; and source/drain regions electrically connected to the plurality of channel layers. In a cross section taken in the second direction, the uppermost channel layer has a width greater than a width of the intermediate channel layer.

20 Claims, 24 Drawing Sheets

(51) Int. Cl.
  *H01L 29/417*  (2006.01)
  *H01L 29/66*  (2006.01)
  *H01L 29/04*  (2006.01)

(52) U.S. Cl.
  CPC .... *H01L 29/6681* (2013.01); *H01L 29/66818* (2013.01); *H01L 29/045* (2013.01)

(58) Field of Classification Search
  CPC .............. H01L 29/045; H01L 29/0673; H01L 29/42392; H01L 29/78696; H01L 29/66795; H01L 29/1033
  See application file for complete search history.

(56) References Cited

U.S. PATENT DOCUMENTS

| | | |
|---|---|---|
| 9,947,804 B1 | 4/2018 | Frougier et al. |
| 9,984,933 B1 | 5/2018 | Xu et al. |
| 10,026,843 B2 | 7/2018 | Lin et al. |
| 10,164,012 B2 | 12/2018 | Fung et al. |
| 10,431,651 B1 | 10/2019 | Chao et al. |
| 10,636,694 B2 | 4/2020 | Chao et al. |
| 10,886,182 B2 * | 1/2021 | Cheng ................... B82Y 10/00 |
| 2019/0378934 A1 | 12/2019 | Hsiao et al. |
| 2020/0381547 A1 | 12/2020 | Song et al. |

OTHER PUBLICATIONS

Notice of Allowance issued Jan. 11, 2023 in U.S. Appl. No. 17/192,301.

* cited by examiner

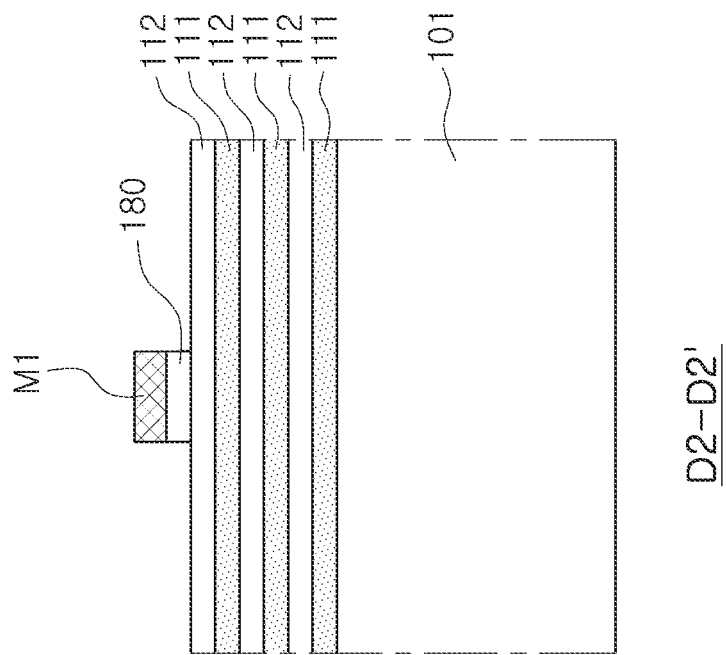
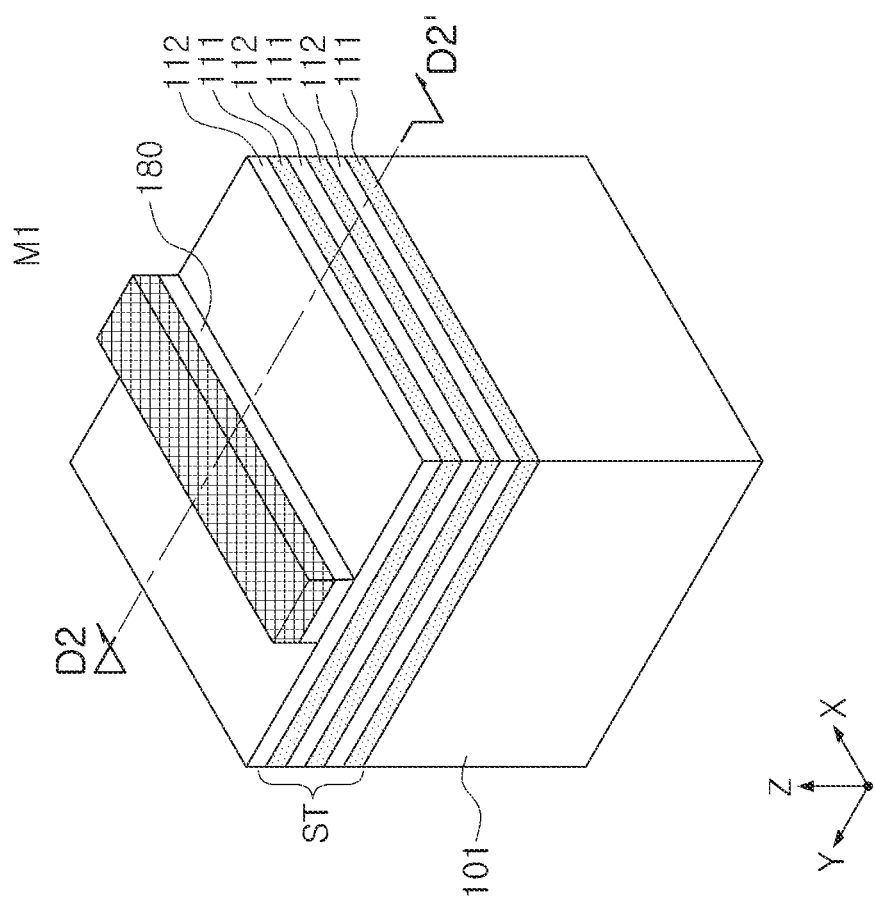
FIG. 4B
FIG. 4A

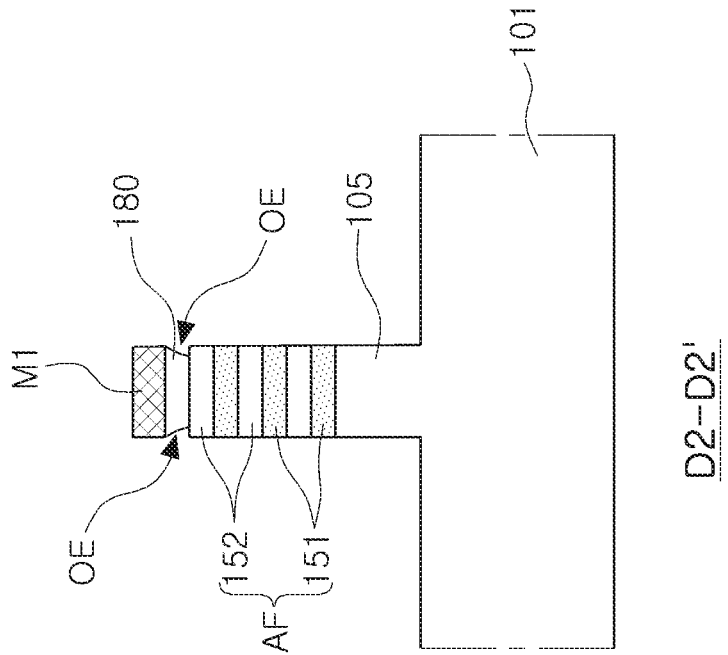
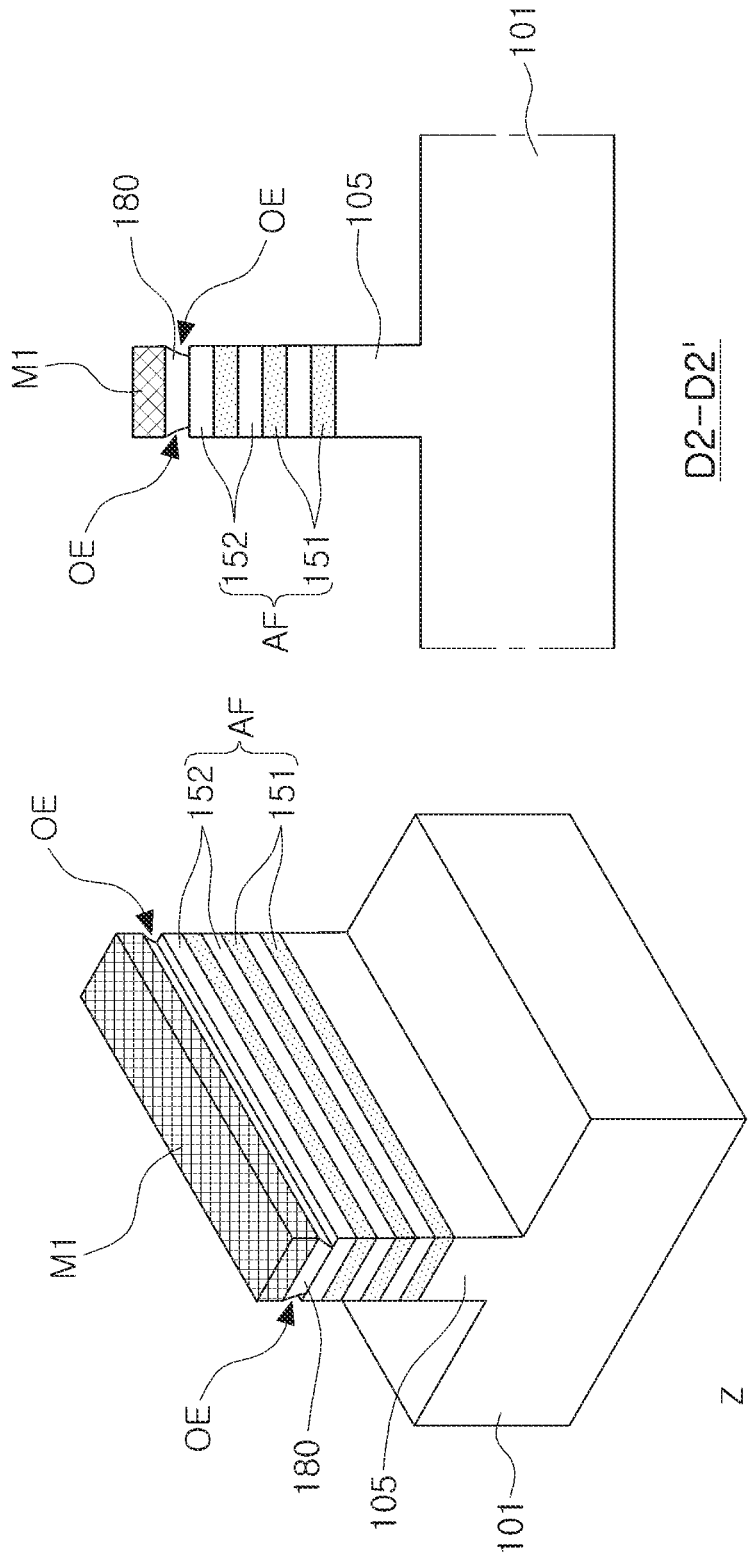
FIG. 5A
FIG. 5B

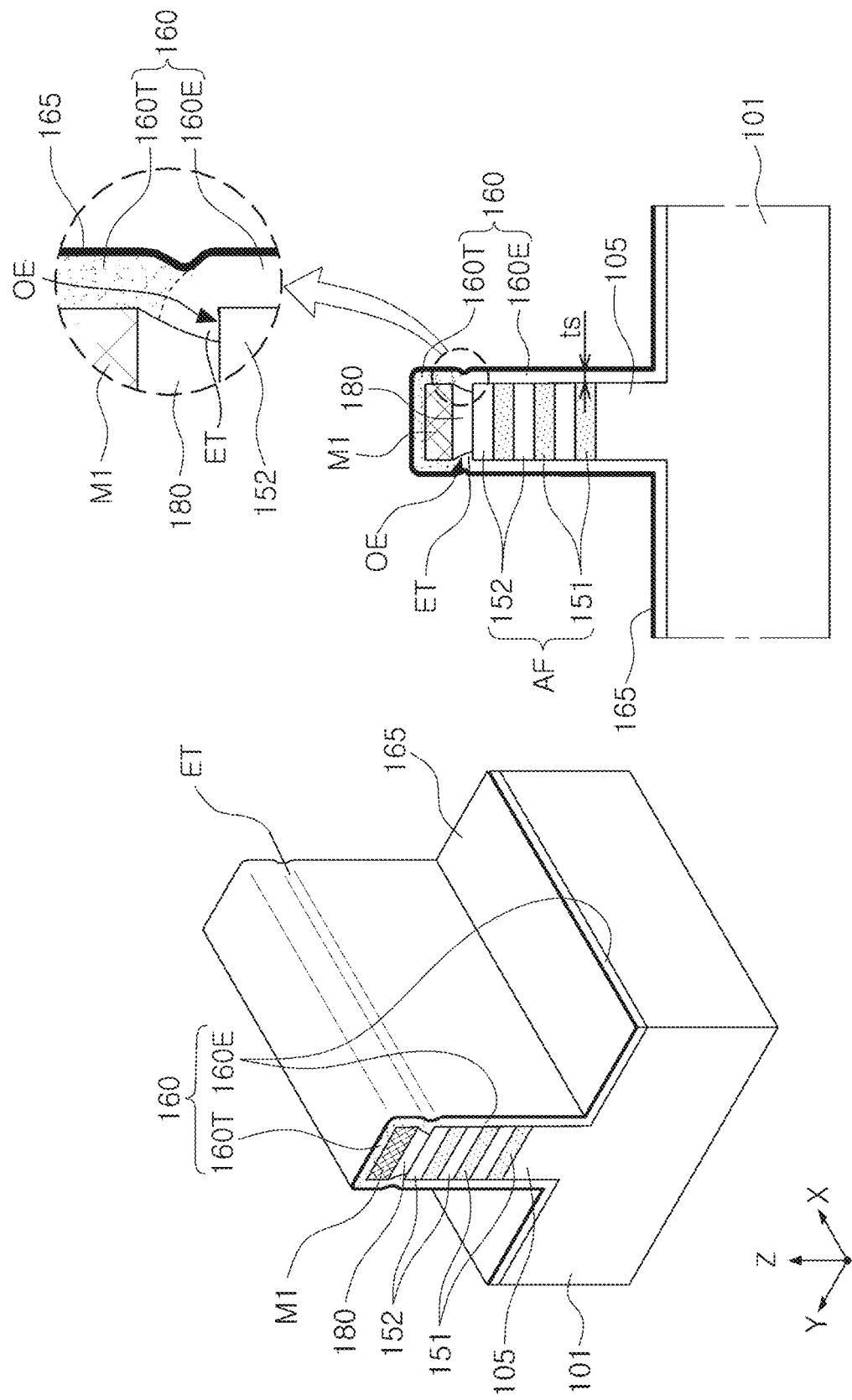

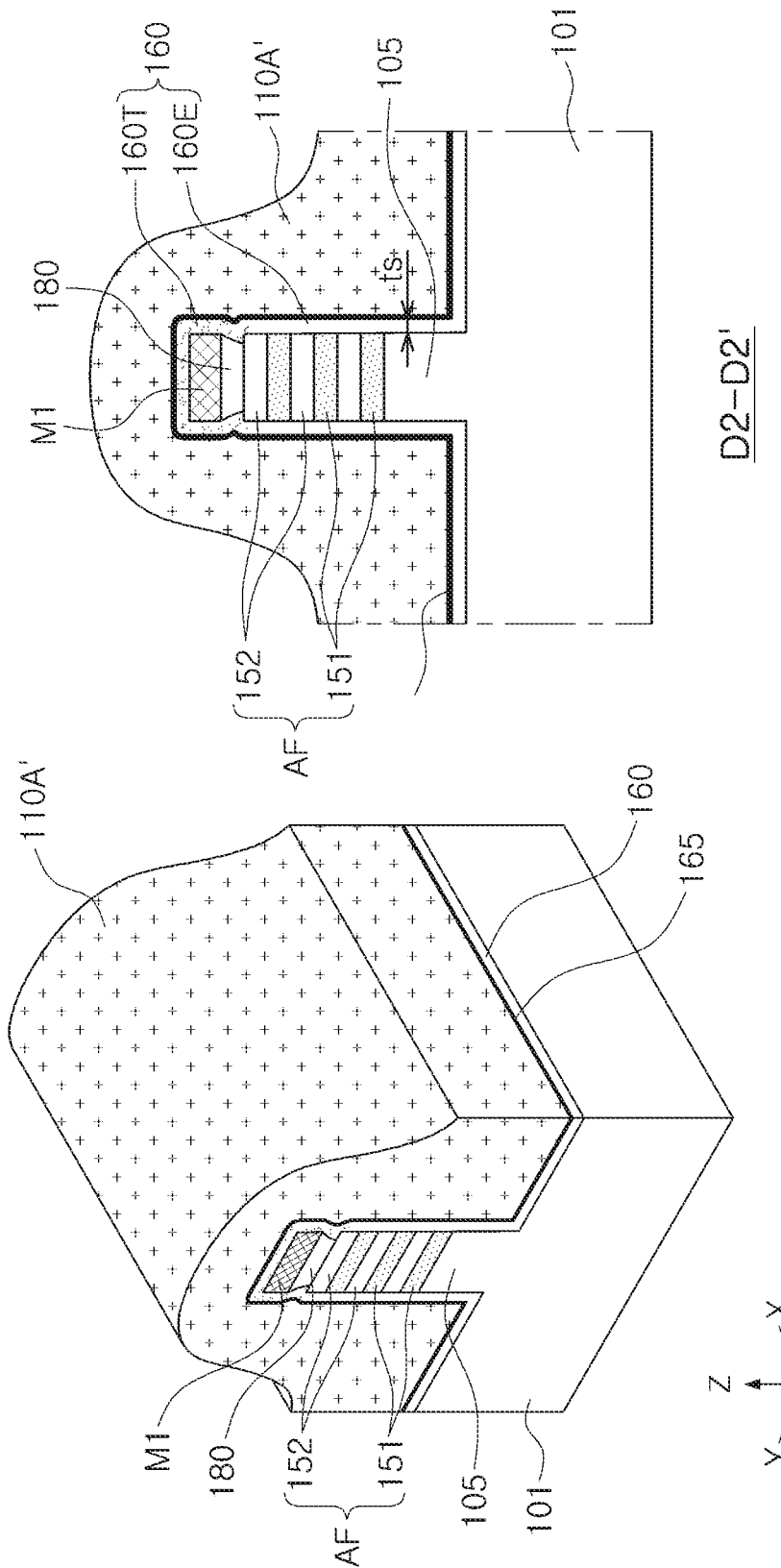

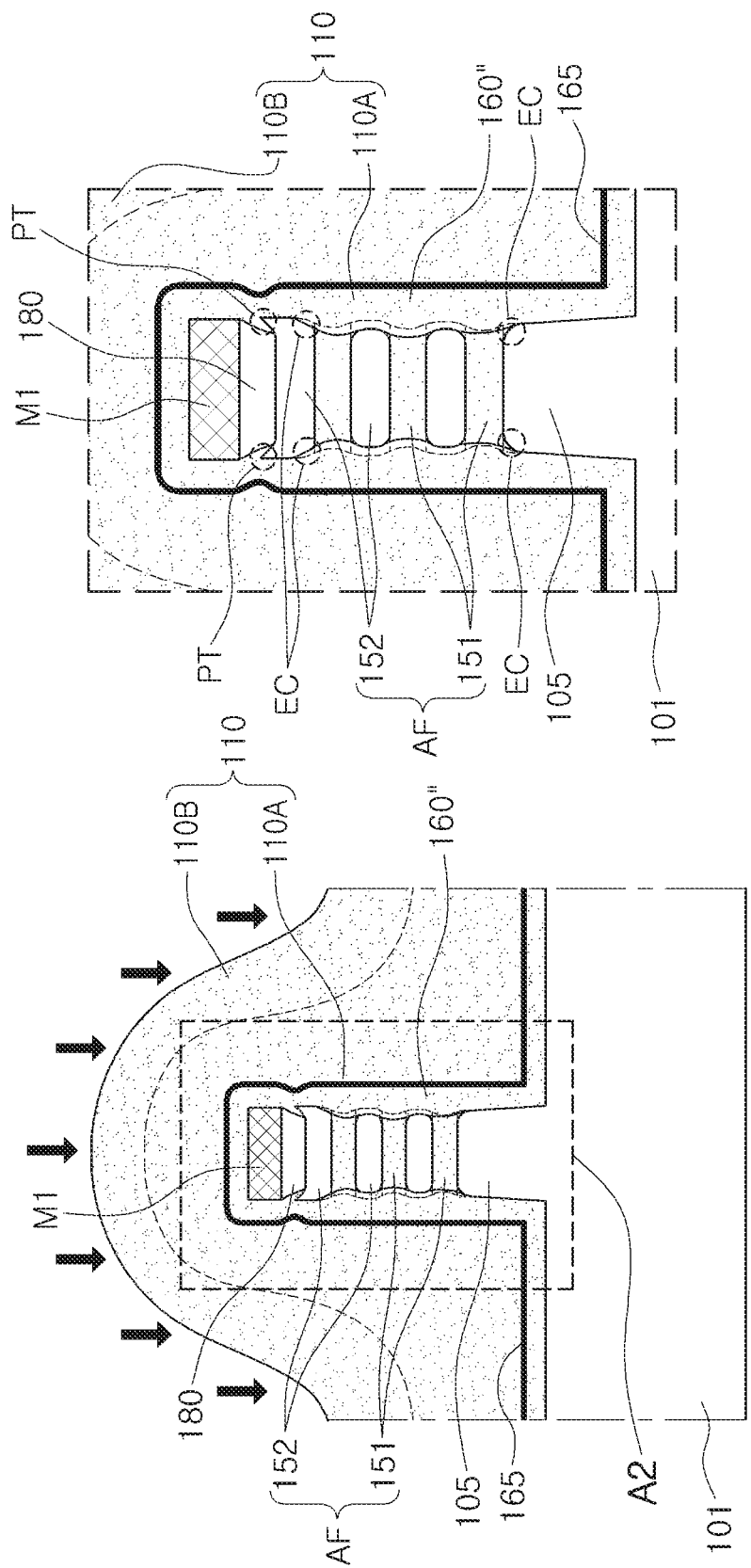

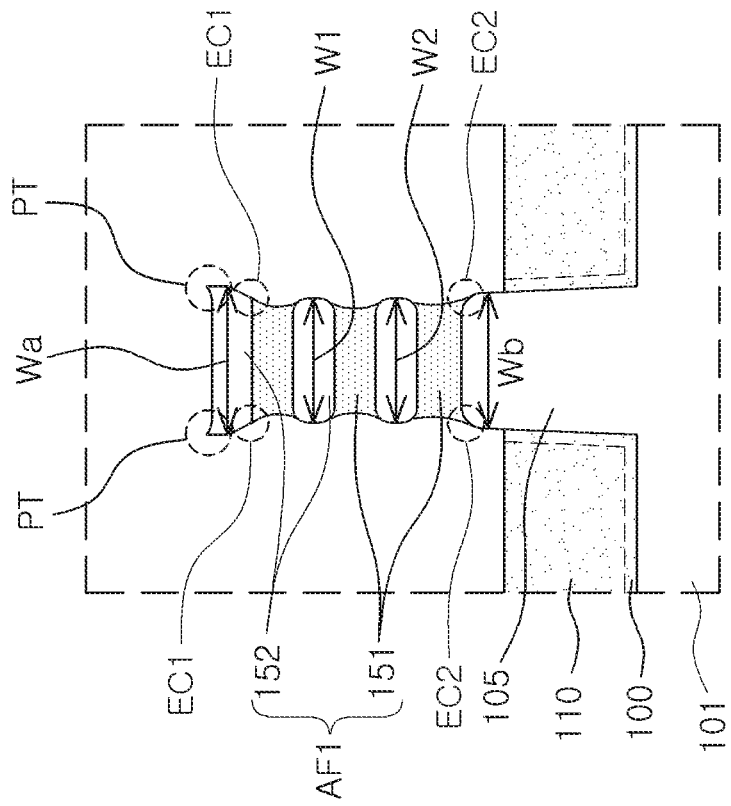
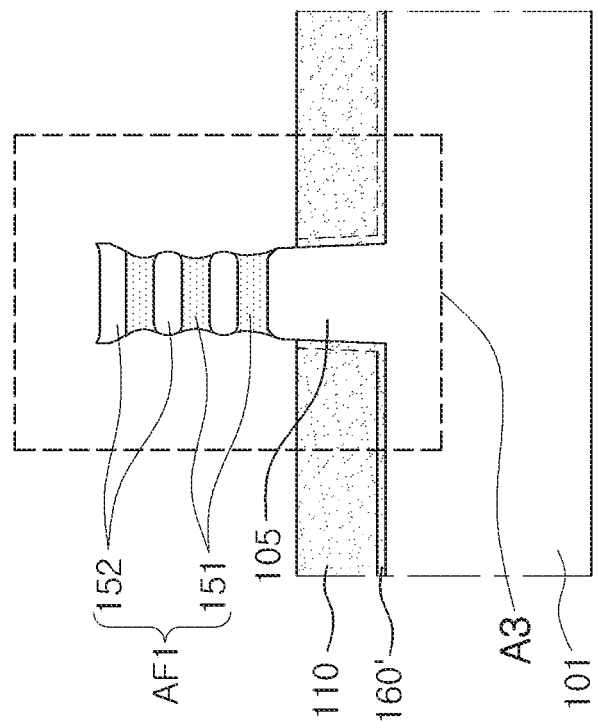
FIG. 10A
FIG. 10B

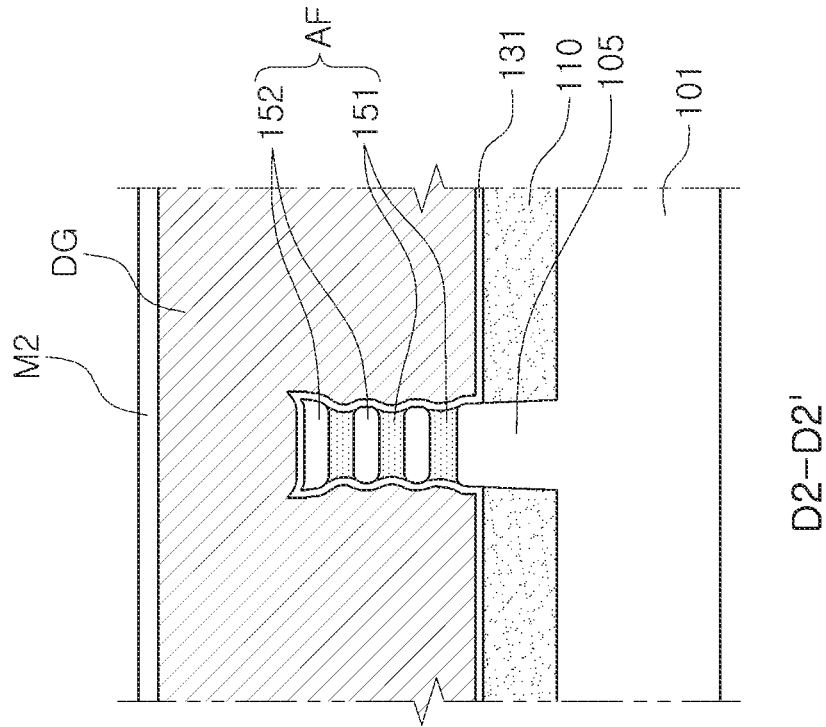
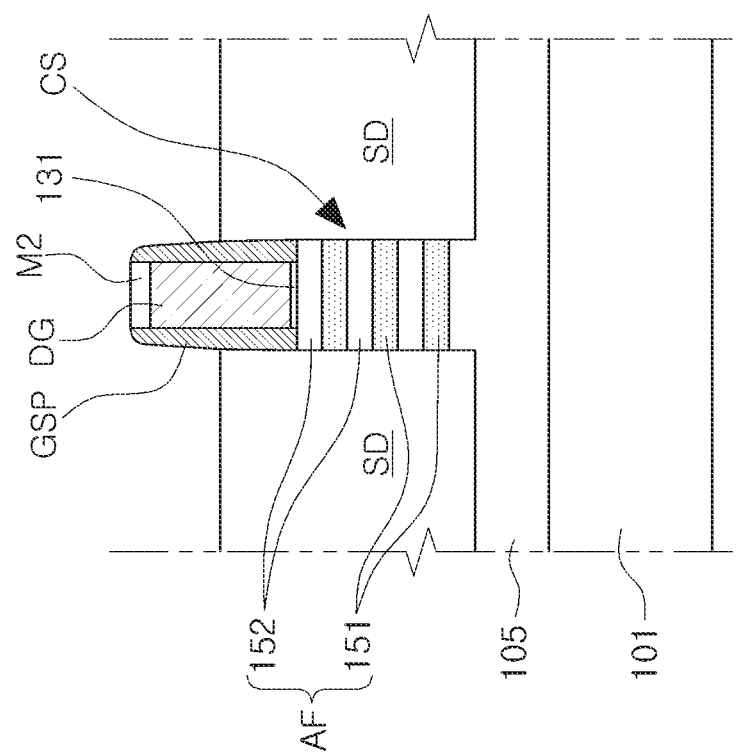
FIG. 13A
FIG. 13B

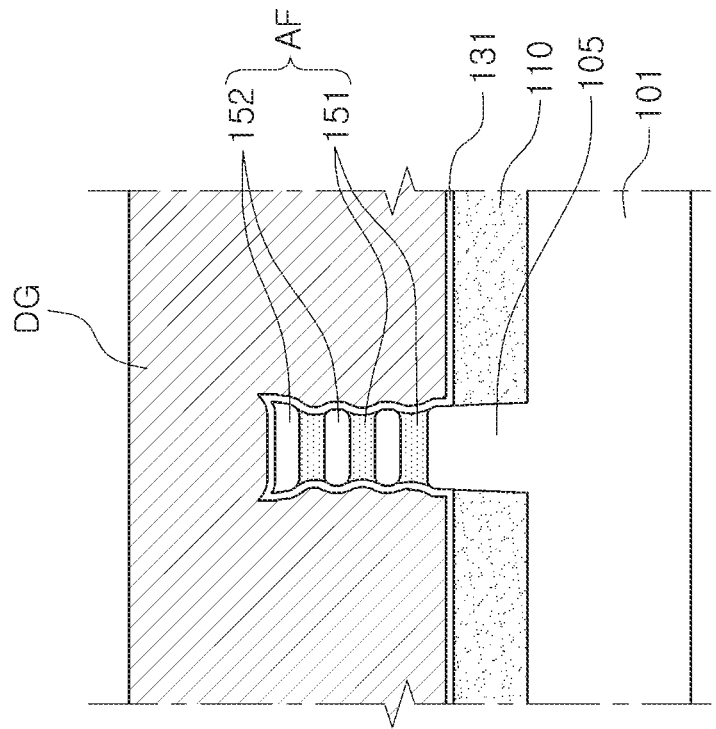
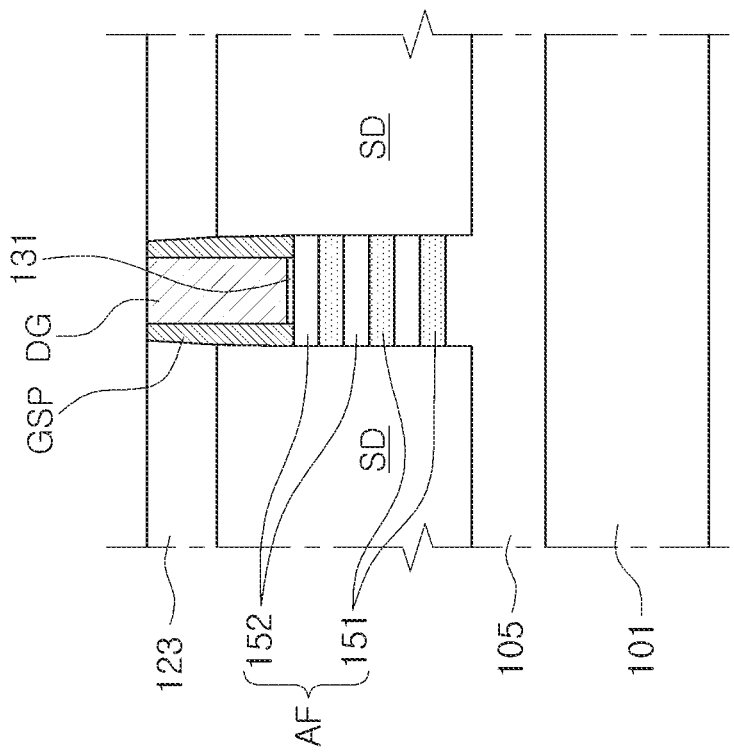
FIG. 14A  D1-D1'
FIG. 14B  D2-D2'

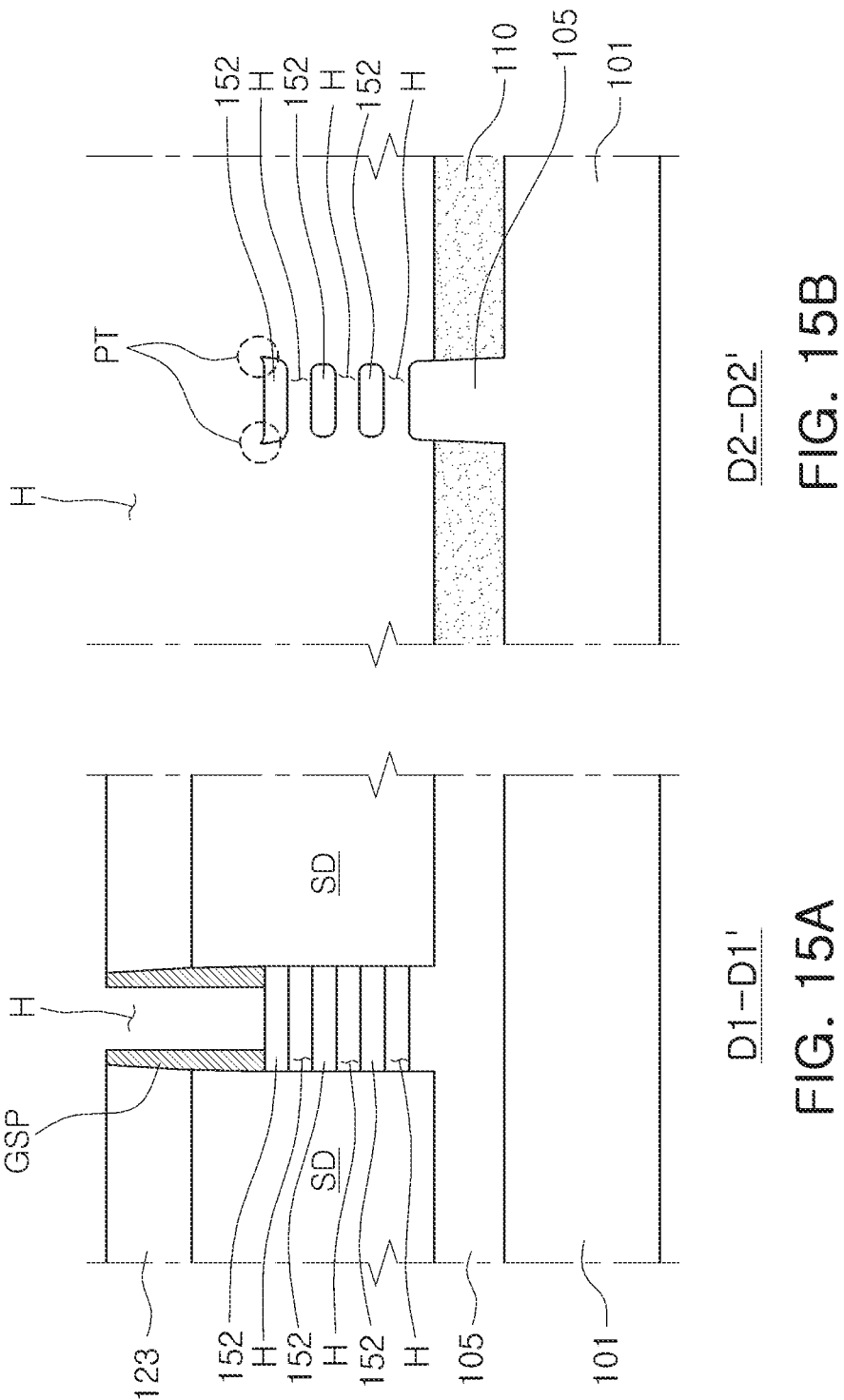

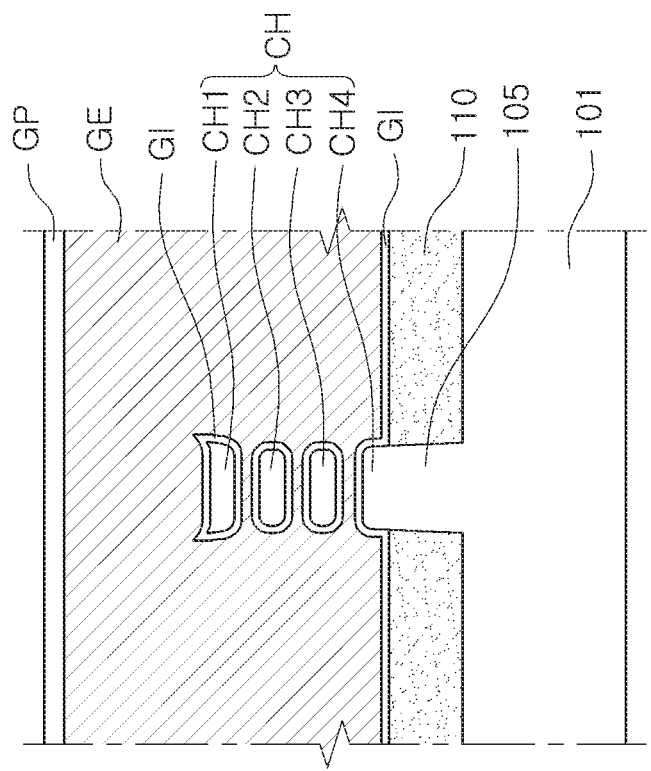
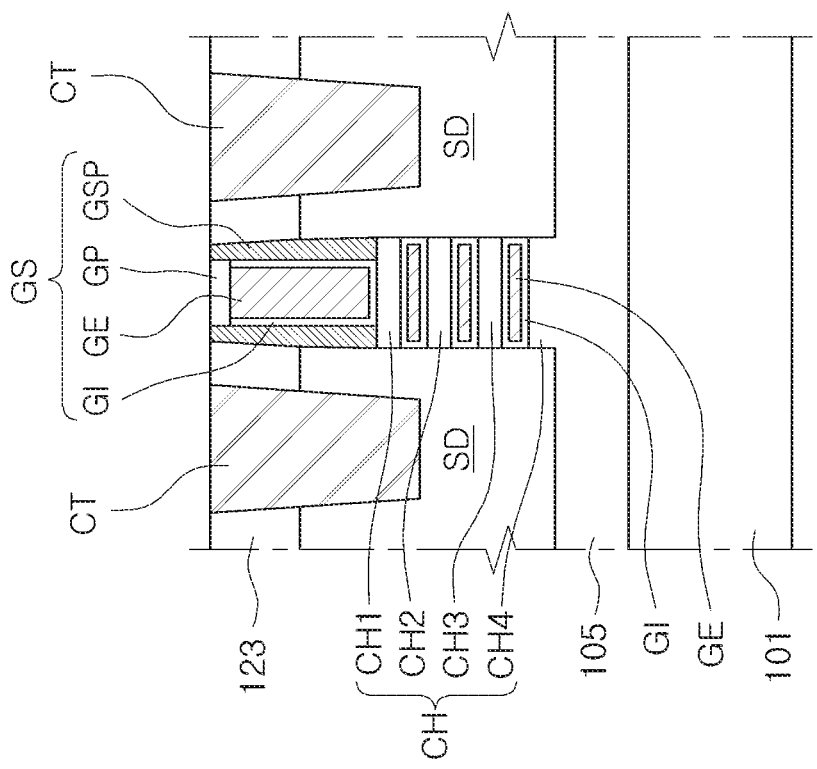
FIG. 16A
FIG. 16B

D2b-D2b'

SEMICONDUCTOR DEVICES AND METHOD OF FABRICATING THE SAME

CROSS-REFERENCE TO RELATED APPLICATIONS

This application is a Continuation of U.S. application Ser. No. 17/192,301, filed on Mar. 4, 2021, which claims the benefit under 35 USC 119(a) of Korean Patent Application No. 10-2020-0082374 filed on Jul. 3, 2020 in the Korean Intellectual Property Office, the entire disclosure of each of which is incorporated herein by reference for all purposes.

BACKGROUND

1. Field

Some example embodiments relate to semiconductor devices and a method of fabricating the same.

2. Description of Related Art

In recent years, down-scaling in the sizes of semiconductor devices has been rapidly progressing. In addition, since semiconductor devices require high operating speed and accuracy in operation, various studies are being conducted for optimizing the structure of transistors included in semiconductor devices. For example, as scaling technology for increasing the density of integrated circuit devices, efforts are being made to develop semiconductor devices including a FinFET having a three-dimensional structure channel in which an active fin is formed on a substrate and a gate is formed using the active fin.

SUMMARY

Example embodiments provide a semiconductor device having a channel including a three-dimensional structure, with improved electrical characteristics and reliability and a method of fabricating the same.

According to some example embodiments, a semiconductor device may include a substrate including a fin-type active region, the fin-type active region extending in a first direction parallel to an upper surface of the substrate; a plurality of channel layers on the fin-type active region, the plurality of channel layers including an uppermost channel layer, a lowermost channel layer, and an intermediate channel layer isolated from direct contact with each other in a direction perpendicular to the upper surface of the substrate; a gate electrode surrounding the plurality of channel layers and extending in a second direction, the second direction parallel to the upper surface of the substrate and intersecting the first direction; a gate insulating film between the plurality of channel layers and the gate electrode; and source/drain regions electrically connected to the plurality of channel layers. In a cross section taken in the second direction, the uppermost channel layer may have a width greater than a width of the intermediate channel layer.

According to some example embodiments, a semiconductor device may include a substrate including a fin-type active region extending in a first direction, the first direction parallel to an upper surface of the substrate; a plurality of channel layers on the fin-type active region, the plurality of channel layers isolated from direct contact with each other in a direction perpendicular to the upper surface of the substrate and including an uppermost channel layer, a lowermost channel layer, and an intermediate channel layer; a gate electrode surrounding the plurality of channel layers and extending in a second direction, the second direction parallel to the upper surface of the substrate and intersecting the first direction; a gate insulating film between the plurality of channel layers and the gate electrode; and source/drain regions electrically connected to the plurality of channel layers. In a cross section taken in the second direction, the lowermost channel layer may have a width greater than a width of the intermediate channel layer and have an upwardly inclined side surface.

According to some example embodiments, a semiconductor device may include a substrate including a fin-type active region extending in a first direction, the first direction parallel to an upper surface of the substrate; a plurality of channel layers on the fin-type active region, the plurality of channel layers isolated from direct contact with each other in a direction perpendicular to the upper surface of the substrate and including an uppermost channel layer, a lowermost channel layer, and an intermediate channel layer; a gate electrode surrounding the plurality of channel layers and extending in a second direction, the second direction parallel to the upper surface of the substrate and intersecting the first direction; a gate insulating film between the plurality of channel layers and the gate electrode; and source/drain regions electrically connected to the plurality of channel layers. In a cross section taken in the second direction, the uppermost channel layer and the lowermost channel layer may each have a width greater than the width of the intermediate channel layer, and an upper surface of the uppermost channel layer may have a protruding edge portion.

According to some example embodiments, a method of fabricating a semiconductor device may include forming a stack structure by alternately stacking a plurality of first semiconductor layers and a plurality of second semiconductor layers on an active region of a substrate; etching the stack structure to form a fin-shaped structure on the active region; forming a silicon epitaxial liner on a surface of the fin-shaped structure; forming a gap-fill insulating film on the silicon epitaxial liner to surround the fin-shaped structure; applying an annealing process to the gap-fill insulating film; and partially removing the gap-fill insulating film to expose the fin-shaped structure.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 4A, 5A, 6A, and 7A are perspective views illustrating some processes (a fin structure formation process) in a method of fabricating a semiconductor device according to some example embodiments;

FIGS. 4B, 5B, 6B, and 7B are cross-sectional views of process results of FIGS. 4A, 5A, 6A, and 7A taken along line D2-D2', respectively;

FIGS. 8A, 9A, and 10A are cross-sectional views illustrating some processes (forming a device isolation layer) in a method of fabricating a semiconductor device according to some example embodiments;

FIGS. 8B, 9B, and 10B are partially enlarged views of portions of cross sections of FIGS. 8A, 9A, and 10A, respectively;

FIGS. 13A, 14A, 15A, and 16A and 13B, 14B, 15B, and 16B are cross-sectional view taken along lines D1-D1' and D2-D2', respectively, illustrating some other processes (gate structure formation) in a method of fabricating a semiconductor device according to some example embodiments;

DETAILED DESCRIPTION

Figure 1:
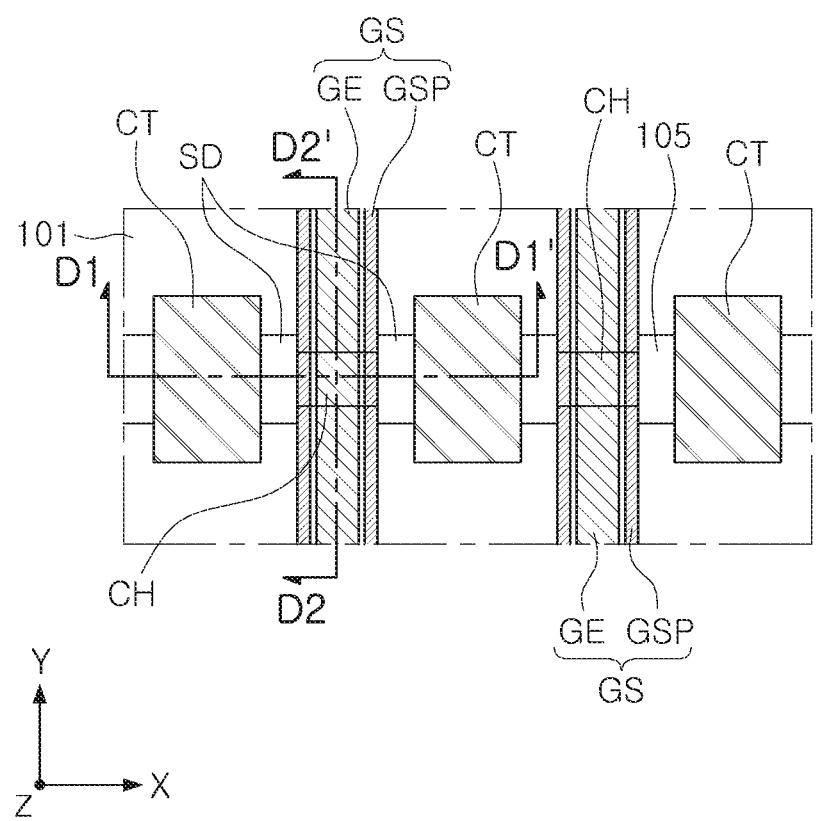
FIG. 1 is a plan view illustrating a semiconductor device according to some example embodiments.

Hereinafter, various embodiments will be described in detail with reference to the accompanying drawings.

Hereinafter, terms such as 'on,' 'upper portion,' 'upper surface,' 'below,' 'lower portion,' 'lower surface,' 'side surface,' and the like can be understood as referring to the spatial relationship between elements, components, regions, layers, and/or sections, based on the orientation of those elements, components, regions, layers, and/or sections in the drawings, unless otherwise indicated. Similarly, although the terms 'first,' 'second,' 'third,' etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section.

Figure 2:
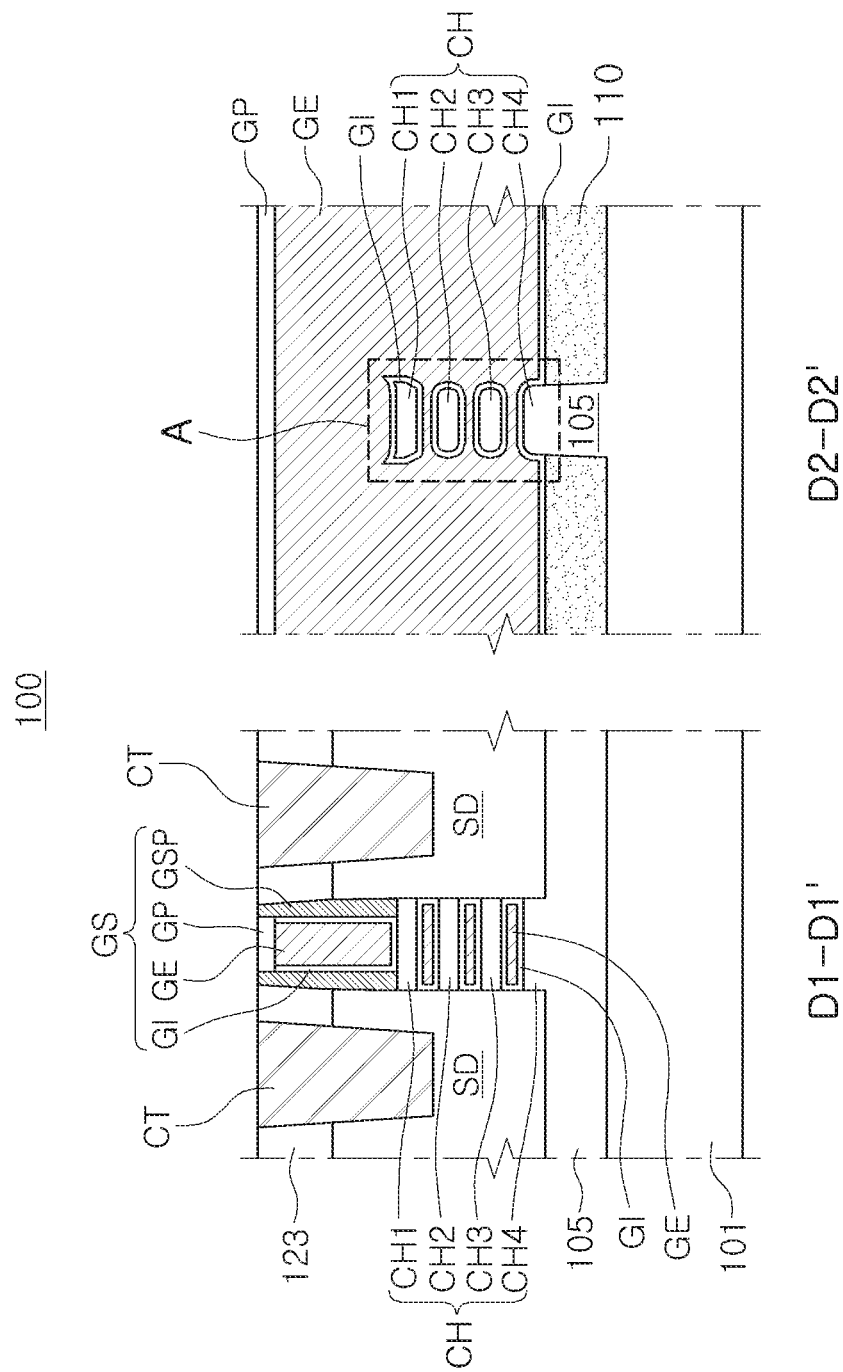
FIG. 2 provide cross-sectional views of the semiconductor device illustrated in FIG. 1 taken along lines D1-D1' and D2-D2'.
Figure 3:
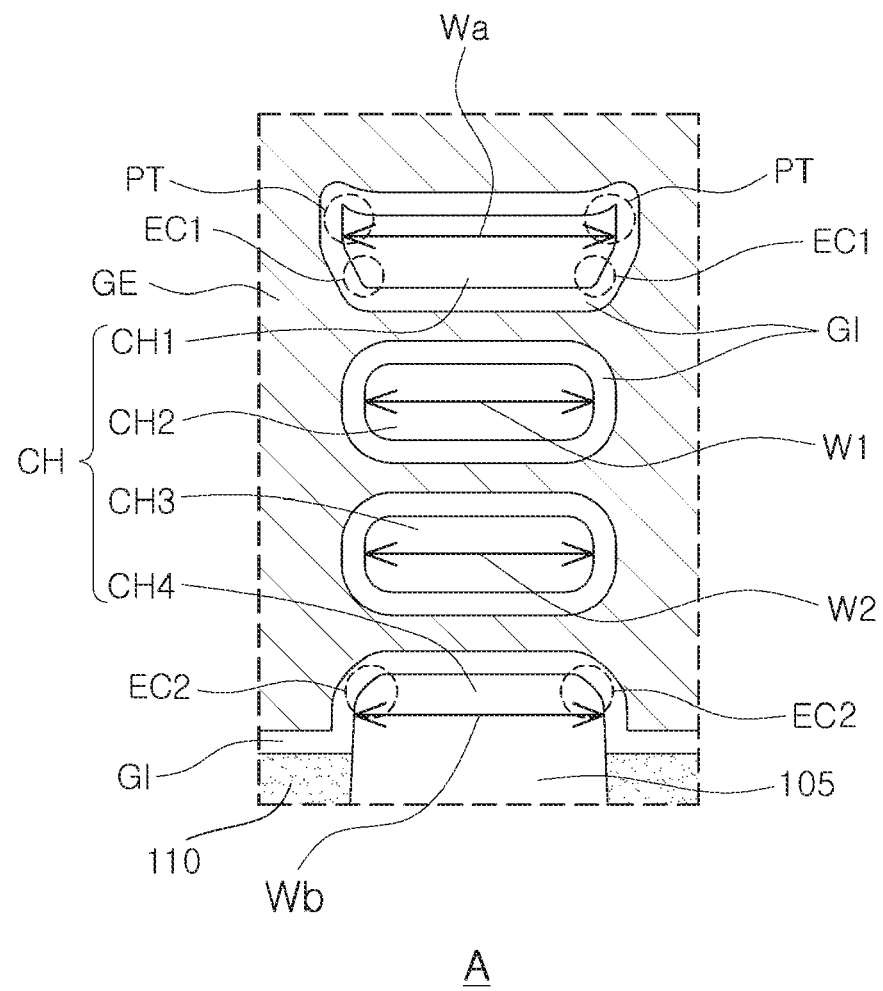
FIG. 3 is an enlarged cross-sectional view of portion "A" of the semiconductor device of FIG. 2.

FIG. 1 is a plan view illustrating a semiconductor device according to an example embodiment, FIG. 2 is a cross-sectional view of the semiconductor device illustrated in FIG. 1 taken along lines D1-D1' and D2-D2', and FIG. 3 is an enlarged cross-sectional view of portion "A" of the semiconductor device of FIG. 2.

Referring to FIGS. 1 to 3, a semiconductor device 100 according to some example embodiments may include a substrate 101, an active region 105 disposed on the substrate 101, a plurality of channel layers CH disposed on the active region 105, and a gate structure GS surrounding the plurality of channel layers CH.

The active region may be a fin-type active region (hereafter referred to as a fin-type active region 105) and may be provided on the substrate 101. The substrate 101 may be a semiconductor substrate. For example, the substrate 101 may be an elemental semiconductor (e.g., silicon (Si) and/or a germanium (Ge)) substrate, a compound semiconductor substrate (e.g., SiGe), and/or a semiconductor on insulator substrate (e.g., silicon on insulator (SOI)) substrate. The fin-type active region 105 may have a fin structure. The fin structure may protrude from an upper surface of the substrate 101 in a direction perpendicular to the upper surface of the substrate 101 (e.g., a Z direction) and extend in a first direction parallel to the upper surface of the substrate 101 (e.g., an X Direction). In the illustrated example embodiment, the fin structure of the fin-type active region 105 is illustrated as one, but may be provided as a plurality of fin structures arranged in parallel in a second direction (e.g., a Y direction) intersecting the first direction (e.g., the X direction).

Device isolation layers 110 may be provided on the substrate 101 on both sides of the fin-type active region 105. The device isolation layer 110 may define the fin-type active region 105. For example, the device isolation layer 110 may include an electrically insulating material. The device isolation layer 110 may include, for example, an oxide, a nitride, and/or an oxynitride. In some embodiments, the device isolation layer 110 may expose upper sidewalls of the fin-type active region 105. The upper surface of the device isolation layer 110 may be located on a level lower than the upper surface of the active region 105.

The plurality of channel layers CH may be spaced apart from each other in a direction (e.g., Z direction) perpendicular to the upper surface of the substrate 101. The plurality of channel layers CH may include a first channel layer CH1 located as an uppermost layer, a fourth channel layer CH4 located as a lowermost layer, and second and third channel layers CH2 and CH3 sequentially disposed between the first channel layer CH1 and the fourth channel layer CH4. In this case, the second and third channel layers are referred to as intermediate channel layers. The lowermost fourth channel layer CH4 is provided as an upper region of the fin-type active region 105, and the remaining channel layers, for example, the first to third channel layers CH1, CH2 and CH3, respectively, may be disposed to be spaced apart from each other from the fin-type active region 105 in the direction perpendicular to the upper surface of the substrate 101 (e.g., the Z direction). Each of the first to third channel layers CH1, CH2 and CH3 may be formed of a nanosheet and/or may include a semiconductor material that is the same as or similar to semiconductor material of the fin-type active region 105. For example, the plurality of channel layers CH and the fin-type active region 104 may both share a type of semiconductor (e.g., Group IV elemental (e.g., Si, and/or Ge) and/or compound semiconductors (e.g., SiGe)), and/or may include the same semiconductor material (e.g., Si and/or Ge) but with different types and/or concentrations of impurities (e.g., dopants).

The first and fourth channel layers CH1 and CH4 disposed at the top and bottom, respectively, may have a width greater than that of the intermediate channel layers in a first direction parallel to the upper surface of the substrate 101 (e.g., the X direction). For example, the first and fourth channel layers CH1 and CH4 may be wider than the second and third channel layers CH2 and CH3. This difference in width may appear in a cross section taken in the second direction (e.g., the Y direction), as illustrated in FIG. 3 and the right cross section of FIG. 2, but may not appear in the cross section in the first direction (e.g., the X direction) illustrated in the left cross section of FIG. 2. Even if a difference appears, in the cross section in the first direction (refer to the left cross section of FIG. 2), a difference between the widths of the second and third channel layers CH2 and CH3, and the widths of the first and fourth channel layers CH1 and CH4, may be less than a difference in width in the cross section taken in the second direction (refer to the right cross section in FIG. 2). For example, in the cross section in the first direction, the first to fourth channel layers CH1, CH2, CH3, and CH4 may have substantially the same width. For example, the difference in the width of the channel layer in the cross-section in the second direction (refer to the right cross-section in FIG. 2) may range from about 1 nm to about 10 nm, but is not limited thereto.

As illustrated in FIG. 3, the first channel layer CH1, which is an uppermost channel layer, may have protruding portions PT on both sides of the upper surface thereof. The protruding portion PT may have a relatively pointed end toward an upper portion. This protruding portion PT may extend in the first direction (see FIGS. 12A and 12B). As such, in the cross section taken in the second direction (refer to the right cross section in FIG. 2), the upper surface of the first channel layer CH1 has the protruding portion PT, but a cross section in the first direction (refer to the left cross section in FIG. 2), the first channel layer CH1 may have a substantially flat upper surface.

The first and fourth channel layers CH1 and CH4 have a greater width (Wa, Wb) than widths (W1, W2) of the second and third channel layers CH2 and CH3 disposed therebetween, and the volume of the channel region of the first channel layer CH1 may be increased by the protruding portion PT, and as a result, direct current ("DC") performance of the semiconductor device may be improved.

In addition, as illustrated in FIG. 3, the first channel layer CH1 may have downwardly inclined side surfaces EC1. Similarly, the fourth channel layer CH4 may have upwardly inclined side surfaces EC2. On the other hand, both side sectional surfaces of the second and third channel layers CH2 and CH3 may have a convex shape.

The width and shape of the channel layers CH1, CH2, CH3 and CH4 may be determined by the result of a partial encroachment of a sacrificial layer (such as SiGe) located between the channel layers CH1, CH2, CH3 and CH4 during an annealing process for forming a gap-fill insulating film (see FIGS. 8B and 9B) after the introduction of the silicon epitaxial liner, and may be determined by the result that, in this process, the portion of the channel layers CH1, CH2, CH3 and CH4 adjacent to the encroached portion of the sacrificial layer is also encroached.

For example, the plurality of channel layers CH may include at least one of silicon (Si), silicon germanium (SiGe), and germanium (Ge). The channel layers CH employed in this embodiment are illustrated as introducing three nanosheets for the first to third channel layers CH1, CH2, and CH3, but the number of nanosheets introduced as the channel layers is not limited thereto, and may be changed to a plurality of different numbers.

The gate structure GS may be disposed on the fin-type active region 105 and may intersect the fin-type active region 105.

The gate structure GS includes a gate electrode GE surrounding the plurality of channel layers CH and extending in the second direction (e.g., the Y direction) intersecting the first direction (e.g., the X direction). The gate electrode GE may surround the first to third channel layers CH1, CH2, and CH3 in the second direction (e.g., the Y direction) and cover the fourth channel layer CH4, as illustrated in FIG. 2. The gate electrode GE may include a main portion covering the upper surface of the first channel layer CH1 (also referred to as the "uppermost channel layer"), and a sub-portion connected to the main portion and located in a space between the plurality of channel layers CH. The main portion of the gate electrode GE may extend in the second direction (e.g., the Y direction) and cover an upper surface of the device isolation layer 110 along both side surfaces of the plurality of channel layers CH. The gate electrode may include a conductive material. For example, the gate electrode GE may include a doped semiconductor, a conductive metal nitride, and/or a metal.

A gate insulating film GI may be disposed between the plurality of channel layers CH and the gate electrode GE. The gate insulating film GI may be disposed to surround each of the plurality of channel layers CH in the second direction (e.g., the Y direction). The gate insulating film GI may extend on an upper surface of the device isolation layer 110 in the second direction (e.g., Y direction) and may be disposed between the gate electrode GE and the device isolation layer 110. The gate insulating film GI may include an electrically insulating material. For example, the gate insulating film GI may include at least one of a silicon oxide layer, a silicon nitride layer, a silicon oxynitride layer, and/or a high dielectric layer. The high dielectric layer may include a material having a high dielectric (e.g., a higher dielectric constant than a silicon oxide film) and, for example, may include a hafnium oxide film (HfO), an aluminum oxide film (AlO), and/or a tantalum oxide film (TaO).

The gate structure GS may include gate spacers GSP on side surfaces of the gate electrode GE, and a gate capping pattern GP on the gate electrode GE. The gate insulating film GI may extend between the gate electrode GE and the gate spacers GSP, and an uppermost surface of the gate insulating film GI may be substantially coplanar with the upper surface of the gate electrode GE. The gate spacers GSP and gate capping pattern may include an electrically insulating material. For example, each of the gate spacer GSP and the gate capping pattern GP may include at least one of a silicon oxide layer, a silicon nitride layer, and a silicon oxynitride layer.

In this manner, the gate electrode GE may be provided to surround the channel layers CH to provide a gate-all-around (GAA) type field effect transistor.

Source/drain regions SD may be disposed on fin-type active regions 105 on both sides of the gate structure GS, to be connected to both sides of the plurality of channel layers CH, respectively. The source/drain regions may be regrowth layers selectively regrown from sidewalls of the plurality of channel layers. For example, the source/drain regions SD may be epitaxial layers selectively regrown on sidewalls of the plurality of channel layers CH and the recessed surface of the fin-type active region 105. In this case, the source/drain regions SD may share a similar crystalline structure and/or orientation to the plurality of channel layers CH. The source/drain regions SD may include at least one of SiC, Si, SiGe, or SiP.

An interlayer insulating film 123 may be provided on the source/drain regions SD. The gate structure GS may be located in the interlayer insulating film 123. The upper surface of the interlayer insulating film 123 may be substantially coplanar with the upper surface of the gate capping pattern GP. The interlayer insulating film 123 may include an insulating material, for example at least one of a silicon oxide layer or a silicon oxynitride layer.

The semiconductor device 100 may include contact plugs CT that penetrate through the interlayer insulating film 123 and connect to the source/drain regions SD. The contact plugs CT may include a conductive material, for example a conductive metal nitride such as TiN, WN, and TaN, and/or a metal such as Ti, W, and Ta.

FIGS. 4A, 5A, 6A, and 7A are perspective views illustrating some processes (fin structure forming process) in a method of fabricating a semiconductor device according to some example embodiments, and FIGS. 4B, 5B, 6B, and 7B are cross-sectional views taken along line D2-D2' of FIGS. 4A, 5A, 6A, and 7A, respectively.

Referring to FIGS. 4A and 4B, a stack structure ST in which a first semiconductor layer 111 and a second semiconductor layer 112 are alternately stacked is formed on a substrate 101.

The second semiconductor layers 112 and the first semiconductor layers 111 may be alternately formed on the first semiconductor layer 111 in contact with the substrate 101. An uppermost layer of the stack structure ST may be the second semiconductor layer 112. The first semiconductor layers 111 and the second semiconductor layers 112 may be formed using, for example, an epitaxial growth method, but the example embodiment is not limited thereto. In this case, the first semiconductor layers 111 and the second semiconductor layers 112 may share a similar crystalline structure and/or orientation.

The first semiconductor layers 111 and the second semiconductor layers 112 may include materials having different etch selectivity. The first semiconductor layers 111 may refer to sacrificial semiconductor layers, and the second semiconductor layers 112 may refer to nanosheet semiconductor layers. For example, the first semiconductor layers 111 may be used as sacrificial layers for forming a gate structure, and the second semiconductor layers 112 may be used as a channel layer. The first semiconductor layers 111 may include SiGe. The second semiconductor layers 112 may include, for example, at least one of Si, Ge, and/or a group III-V compound semiconductor.

Subsequently, a first mask pattern M1 extending in the first direction (e.g., the X direction) may be formed on the stack structure ST. The first mask pattern M1 may include, for example, a silicon nitride film and/or a silicon oxynitride film. Before the first mask pattern M1 is formed, a buffer oxide layer 180 may be formed on the stack structure ST (e.g., on an uppermost second semiconductor layer 112) to mitigate a difference in the coefficients of thermal expansion between the materials of the stack structure ST and the first mask pattern M1, thereby reducing and/or preventing the first mask pattern M1 from detaching from the stack structure ST during a subsequent thermal process.

Subsequently, referring to FIGS. 5A and 5B, a fin-shaped structure AF may be formed by etching the stack structure ST using the first mask pattern M1.

For example, a protruding fin-type active region 105 corresponding to the fin-shaped structure AF may be provided by etching a portion of the upper surface of the substrate 101. The fin-shaped structure AF may include first semiconductor patterns 151 and second semiconductor patterns 152 alternately stacked on the fin-type active region 105 of the substrate 101. The fin-shaped structure AF may have a structure extending in the second direction (e.g., the Y direction).

In this etching process, an edge portion of the buffer oxide layer 180 may be partially removed by over-etching, and an edge portion OE of an upper surface of the uppermost second semiconductor layer 152 may be exposed. The exposed edge portion OE may extend in the second direction (e.g., the Y direction). The exposed edge portion OE may be provided as a growth surface (e.g., a nucleation and/or seed surface) of the silicon epitaxial growth in a subsequent silicon epitaxial liner forming process. As a result, the uppermost second semiconductor layer 152, for example, the uppermost channel layer, may have a different shape (e.g., a protruding portion PT), which will be described in detail in subsequent processes.

Next, referring to FIGS. 6A and 6B, the silicon epitaxial liner 160 may be conformally formed on the surface of the fin-shaped structure AF.

Before the silicon epitaxial liner 160 is formed, a process of cleaning the etched surface of the preceding process, using a cleaning solution such as HF or SC-1, may be performed. Oxide-based and/or carbon-based impurities and particles remaining may be removed from the etched surface to prepare the surface for epitaxial growth.

Alternatively, even in the case in which the precleaning process is not sufficiently performed, the protruding portion PT (e.g., a conical producing portion) may be formed in the process in which an amorphous portion 160T is crystallized on the first mask pattern M1 from a portion 160E of a silicon epitaxial liner 160 on the side surface of the fin-shaped structure AF.

The silicon epitaxial liner 160 may be formed by performing a general epitaxial growth process for the entire area including a peripheral circuit area (e.g., I/O circuit area) (not illustrated) and/or a selective epitaxial growth (SEG) for only the cell area. In the case of general epitaxial growth, polysilicon and/or amorphous silicon, rather than the epitaxial layer, may be formed in the transistor in the peripheral circuit area, depending on the growth surface conditions (see FIG. 20B). Selective epitaxial growth (SEG) may be performed by applying an etchback process to remove a material (e.g., polysilicon) formed in another area (e.g., peripheral circuit area) along with general epitaxial growth.

The silicon epitaxial liner formation is not limited thereto, and may be performed at a relatively low temperature. For example, the silicon epitaxial liner formation may be performed in the range of 300° C. to 700° C. Unlike a silicon nitride (SiN) liner, the silicon epitaxial liner 160 may reduce a well leakage problem caused by the charge of the nitrogen element.

Figure 11:
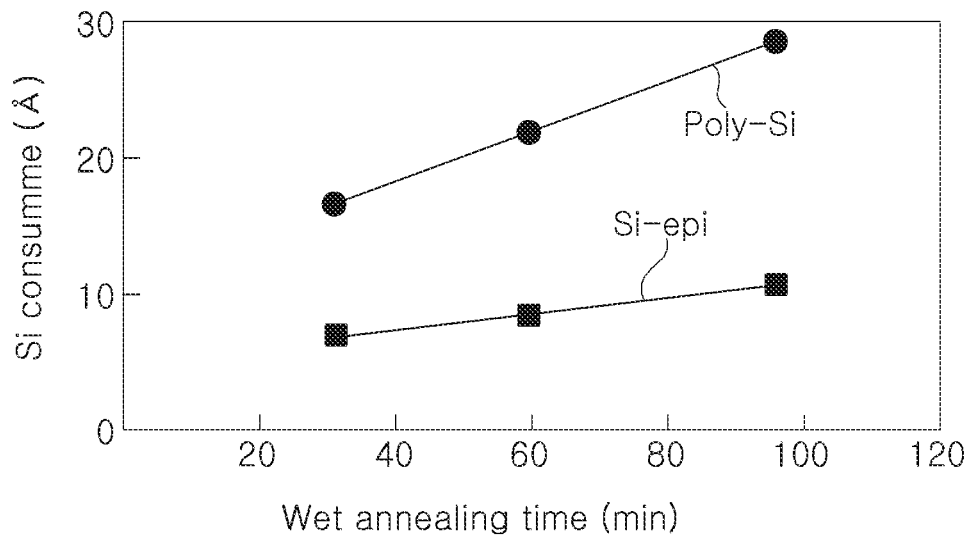
FIG. 11 is a graph illustrating silicon consumption according to an annealing process.

In addition, unlike a polysilicon liner, the silicon epitaxial liner 160 may suppress intermixing of Ge elements in the second semiconductor layers 152, which may include, for example, SiGe. For example, as illustrated in FIG. 11, in the subsequent annealing process, polysilicon may be relatively rapidly oxidized and/or consumed, whereas the oxidization and/or consumption of silicon epitaxial liner is relatively delayed, and therefore is used herein as a liner to prevent intermixing.

In the silicon epitaxial liner 160 formed in this process, the surfaces of the fin-type active region 105 and the portion 160E grown on the side of the fin-shaped structure AF are grown to have a required (and/or otherwise desirable) epitaxial shape, but the portion 160T grown on the surface of the first mask pattern M1, which is an amorphous surface, is therefore not epitaxially grown, but may be formed of amorphous or polysilicon.

On the other hand, in the process of forming the silicon epitaxial liner, the edge portion OE of the upper surface of the second semiconductor layer 152 exposed by removing the buffer oxide layer 180 is provided as an epitaxial growth surface, and the silicon epitaxial portion ET may also be grown on the edge portion OE.

In this process, the silicon epitaxial liner 160 may be conformally formed to have a relatively constant thickness ts. For example, those regions of the silicon epitaxial liner 160 that were epitaxially grown may have a constant thickness ts within manufacturing or operational tolerance. The thickness ts of the silicon epitaxial liner 160 may be oxidized and consumed in a subsequent annealing process, and may be appropriately determined as an intermixing control factor of germanium (Ge). For example, the thickness ts of the silicon epitaxial liner 160 may range from 5 Å to 50 Å.

In this process, after formation of the silicon epitaxial liner, a process of nitriding the surface of the silicon epitaxial liner using plasma may be selectively performed to form a nitridation-processed surface 165. For example, a plasma nitridation process may be applied to the surface of the silicon epitaxial liner 160. The oxidation rate of the silicon epitaxial liner 160 in a subsequent process may be controlled by the nitridation-processed surface 165.

Next, a process of forming the device isolation layer (110 in FIG. 2) may be performed. A process of forming the device isolation layer according to the present embodiment will be described in detail with reference to FIGS. 7A to 10B.

First, referring to FIGS. 7A and 7B, a first gap-fill insulating film 110A' may be formed on the silicon epitaxial liner 180 to surround the fin-shaped structure AF.

The first gap-fill insulating film 110A' may include an oxide layer formed by deposition process like a flowable chemical vapor deposition (FCVD) process and/or a spin coating process. A device isolation layer (110 of FIG. 3) may be form in a process including forming the gap-fill insulating film 110A' and performing an annealing (e.g. a wet annealing) process multiple times (e.g., two or more times), and thus, the first gap-fill insulating film 110A' provided primarily in this process may be sufficiently hardened in a subsequent process.

Figures 8A, 8B:
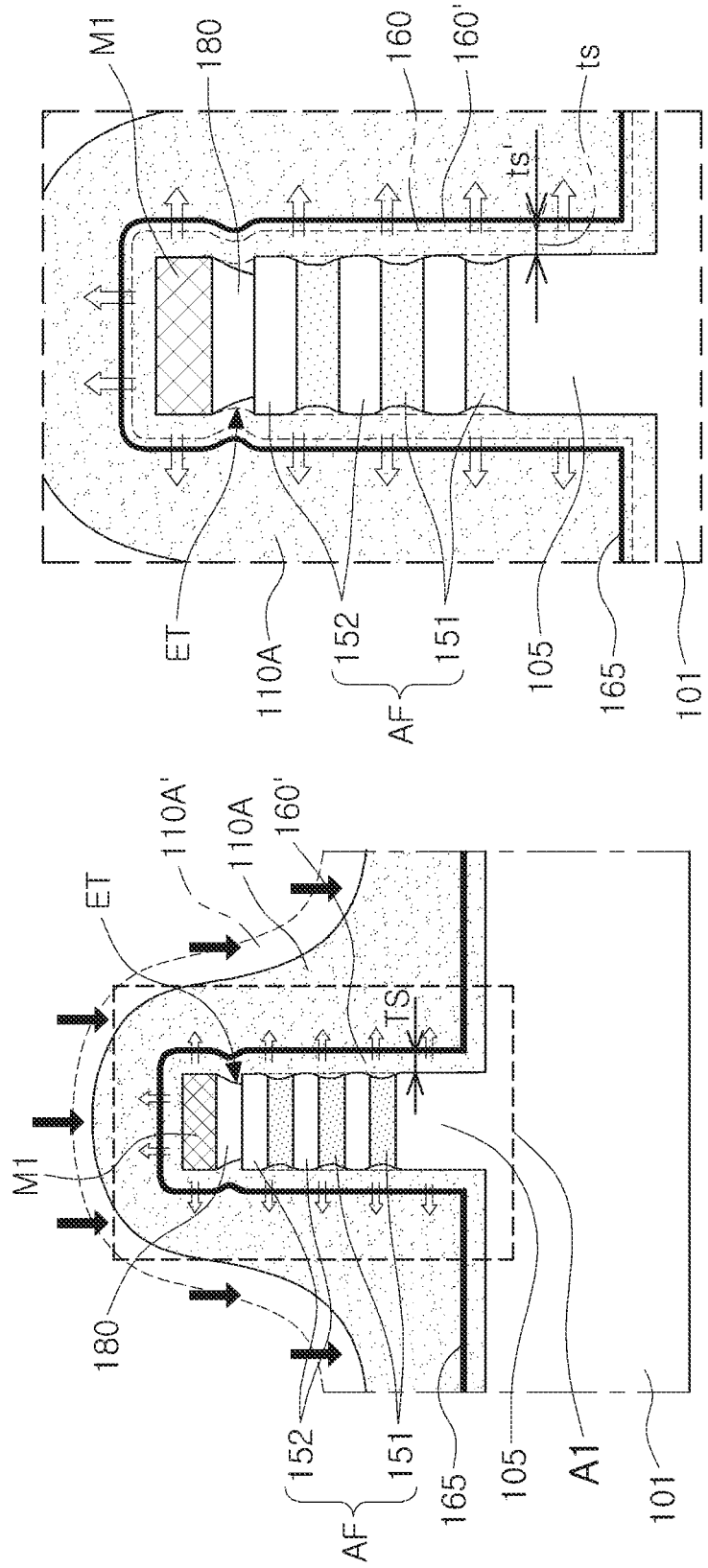

Next, referring to FIGS. 8A and 8B, the first gap-fill insulating film 110A' may be strengthened by using an annealing process.

Through this process, the gap-fill insulating film 110A' may be oxidized, and therefor changed to a first insulating layer 110A of, for example, $SiO_2$. This process may be performed by wet annealing and/or dry annealing (indicated by black arrows). For example, the wet annealing process may be performed at 300° C. to 1100° C. in an $H_2/O_2$ atmosphere. The $H_2/O_2$ atmosphere may, for example, include $H_2O$ vapor. In this process, at least a portion of the silicon epitaxial liner 160 is oxidized, and thus, the volume of the liner 160 may increase (marked by white arrows). Due to the increase in volume of the silicon epitaxial liner 160, compressive stress is applied to the first gap-fill insulating film 110A', so that the first gap-fill insulating film 110A' may be more effectively strengthened. In this manner, the silicon epitaxial liner 160 provides an effect that may contribute to the robustness of the first gap-fill insulating film 110A'.

In this process, compared to a polysilicon liner, the encroachment of the second semiconductor layers 152 (e.g., Si) is greatly alleviated, whereas as illustrated in FIG. 8B, the first encroachment of the semiconductor layers 151 (e.g., SiGe) may occur partially.

Next, referring to FIGS. 9A and 9B, a second gap-fill insulating film 110B may be formed, and an annealing process may be additionally applied.

The gap-fill insulating film formation and annealing process may be repeated until the space between the fin structures AF is sufficiently gap-filled. In this annealing process, the silicon epitaxial liner 160 may be oxidized to generate compressive stress to further strengthen the gap-fill insulating film 110. In addition, a difference in the amount of encroachment between the first and second semiconductor layers 151 and 152 may be amplified during an additional annealing process, so that a change in width and shape of the first and second semiconductor layers 151 and 152 may occur.

On the other hand, a silicon epitaxial portion ET grown on the edge portion OE of the upper surface of the second semiconductor layer 152 from which the buffer oxide layer 180 has been removed may remain as a protruding portion PT on both edges of the upper surface of the uppermost second semiconductor layer 152 even after this process.

In some example embodiments, before forming the second gap-fill insulating film 110B, a polysilicon layer (not illustrated) may be formed on the first gap-fill insulating film 110A. The polysilicon layer may generate a greater compressive stress by contributing as a point and/or region that the oxidation consumption is much larger (see FIG. 11, about 3 times) than that of the silicon epitaxial during the annealing process, thereby greatly contributing to the hardening of the gap-fill insulating film. For example, the polysilicon layer may be deposited at a temperature ranging from 300° C. to 600° C. using Di-IsoPropyl-Amino-Silane (DIPAS) as a seed layer.

Next, referring to FIGS. 10A and 10B, a device isolation layer may be formed by partially removing the gap-fill insulating film so that the fin-shaped structure AF is exposed.

This process may be performed by removing the first mask pattern M1 using a process such as chemical-mechanical polishing ("CMP") and/or performing an etch back process for the gap-fill insulating film 110'. In the etch back process, the fin structure AF and some of the fin-type active areas may be exposed. The silicon epitaxial liner 160 oxidized in this process may remain without being removed, but is omitted for convenience of description. In an actual process, the oxidized liner 160 may be removed together in a process of removing an oxide layer used for a selective process used in forming a gate structure and forming a source/drain.

As described above, in the annealing process described above, a significant amount of encroachment is generated on both sides of the first semiconductor layers 151 in the second direction (e.g., the Y direction), while the second semiconductor layers 152 may hardly be encroached. However, an edge region adjacent to the first semiconductor layers 151 may be partially encroached, and the second semiconductor layers 152 located between the first semiconductor layers 151 have a slightly reduced width in the process in which upper and lower edge regions are encroached.

As a result, as illustrated in FIG. 2, widths Wa and Wb of the first semiconductor layers 152 located at the top and bottom may be greater than widths W1 and W2 of the first semiconductor layers 151 located therebetween. For example, this difference in width may range from about 1 nm to about 10 nm.

Figure 12A:
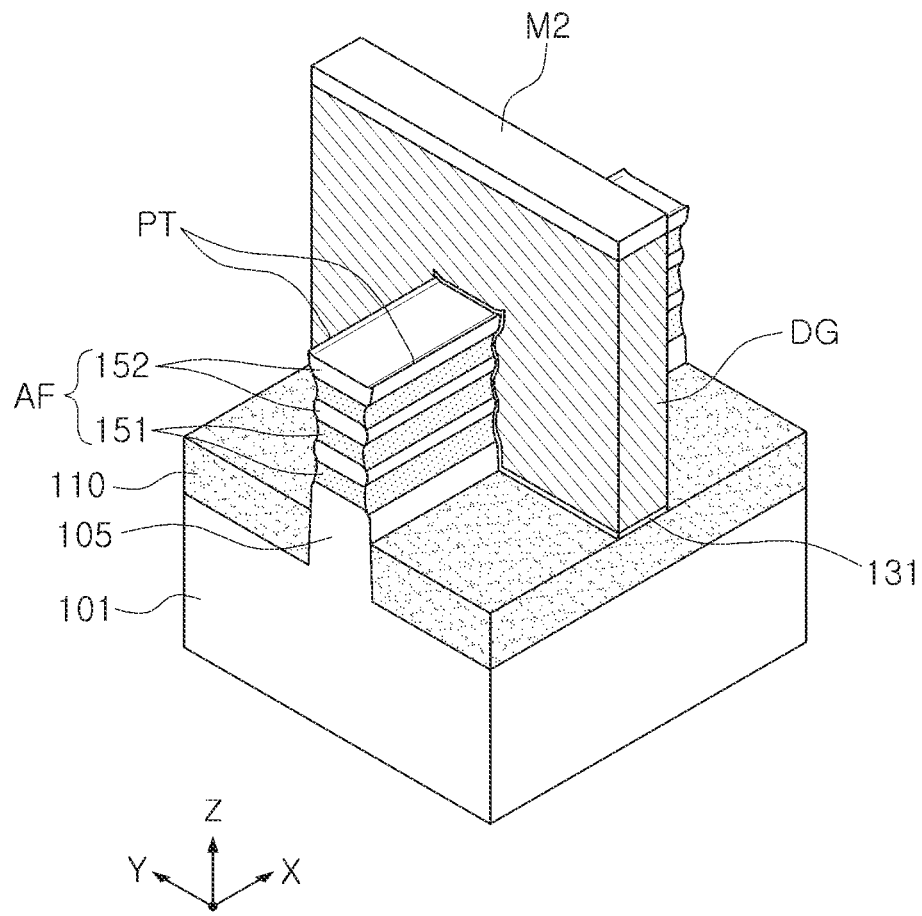
FIGS. 12A to 12D are perspective views illustrating some other processes (dummy gate structure and source/drain formation) in a method of fabricating a semiconductor device according to some example embodiments.

In addition, the second semiconductor layer 152 disposed at the top may have protruding portions PT on both sides of the upper surface thereof. The protruding portion PT may have a relatively pointed end toward the top. As illustrated in FIG. 12A, the protruding portion PT may extend in the first direction (e.g., the X direction).

The second semiconductor layers 152 are provided as channel layers, and the uppermost and lowermost second semiconductor layers 152 have a relatively large width. For example, the uppermost second semiconductor layer 152 may increase the volume of a channel region by the protruding portion PT, and thus, the DC performance of the semiconductor device may be improved.

On the other hand, as illustrated in FIG. 10B, the uppermost second semiconductor layer 152 may have downwardly inclined side surfaces EC1. Similarly, the lowermost second semiconductor layer 152 may have upwardly inclined side surfaces EC2. Both side end surfaces of the second semiconductor layers 152, which are disposed between the first semiconductor layers 151 and of which widths are reduced by encroaching both upper and lower edge regions, may have a convex shape.

Next, a process of forming a gate structure and forming a source/drain may be performed. As described above, an oxidized silicon epitaxial liner 160' may be removed together during the deposition and removal process of the mask (e.g., an oxide film) used for a selective processes (e.g., a P-type transistor region and an N-type transistor region, and/or a cell area and a peripheral circuit area) during gate structure formation and source/drain formation.

FIGS. 12A to 12D are perspective views illustrating some other processes (dummy gate formation and source/drain formation) in a method of fabricating a semiconductor device according to an example embodiment.

Referring to FIG. 12A, a dummy gate electrode DG extending in a second direction (e.g., the Y direction) on the fin-shaped structure AF may be formed.

An etch stop layer 131 and a dummy gate layer (not illustrated) are sequentially formed on the fin structure AF, and an etching process is performed using a second mask pattern M2 to form the dummy gate electrode DG. The dummy gate electrode DG may intersect a partial region of the fin-shaped structure AF, thereby forming the dummy gate electrode DG extending in the second direction (e.g., the Y direction). In this etching process, a semiconductor cap layer 155 and the etch stop layer 131 may also be patterned together with the dummy gate layer. For example, the dummy gate layer and/or the dummy gate electrode DG may include polysilicon and/or amorphous silicon. For example, the etch stop layer 131 may include silicon oxide, silicon nitride, or silicon oxynitride.

Figure 12B:
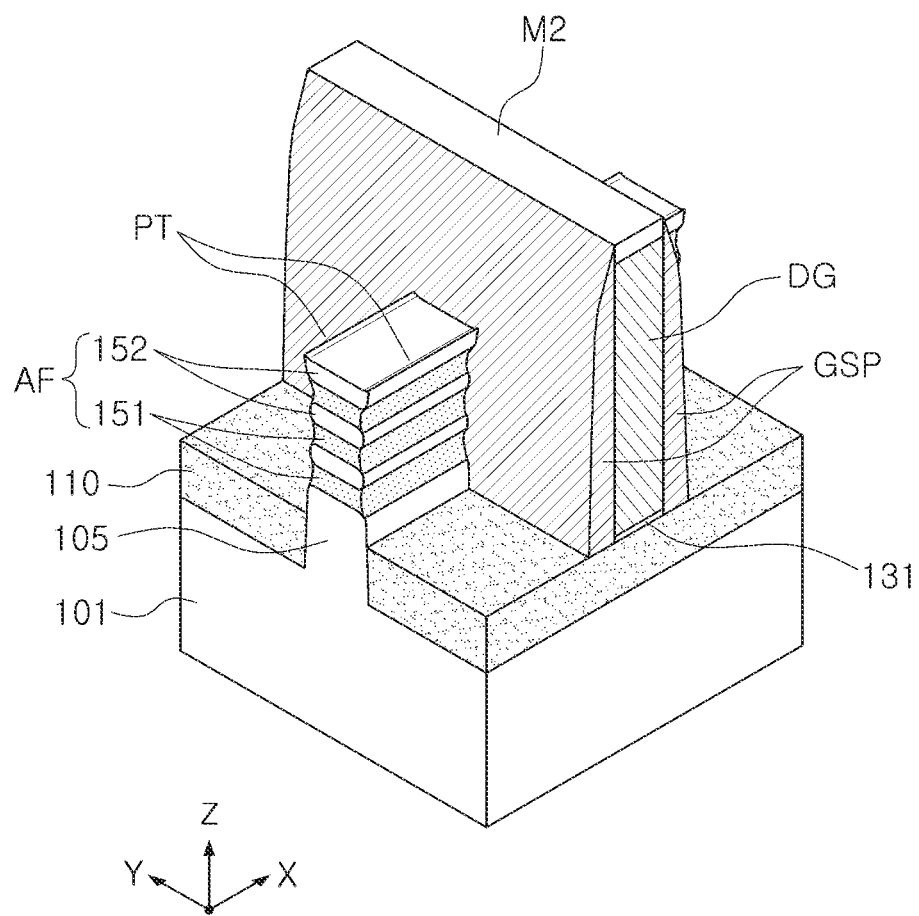

Next, referring to FIG. 12B, a gate spacer GSP may be formed on a sidewall of the dummy gate electrode DG.

For example, a spacer layer (not illustrated) covering the dummy gate electrode DG and the fin-shaped structure AF may be formed on the substrate 101. Subsequently, the spacer layer may be etched back to form the gate spacer GSP remaining on the sidewall of the dummy gate electrode DG. The gate spacer GSP may include an oxide, nitride, oxynitride, oxycarbonitride, or a combination thereof. For example, gate spacer GSP may include silicon nitride (SiN), silicon oxynitride (SiON), silicon oxide ($SiO_2$), silicon oxycarbonitride (SiOCN), or combinations thereof. Each of the gate spacers GSP may include a single layer, but is not limited thereto, and may, for example, have a multilayer structure.

Figure 12C:
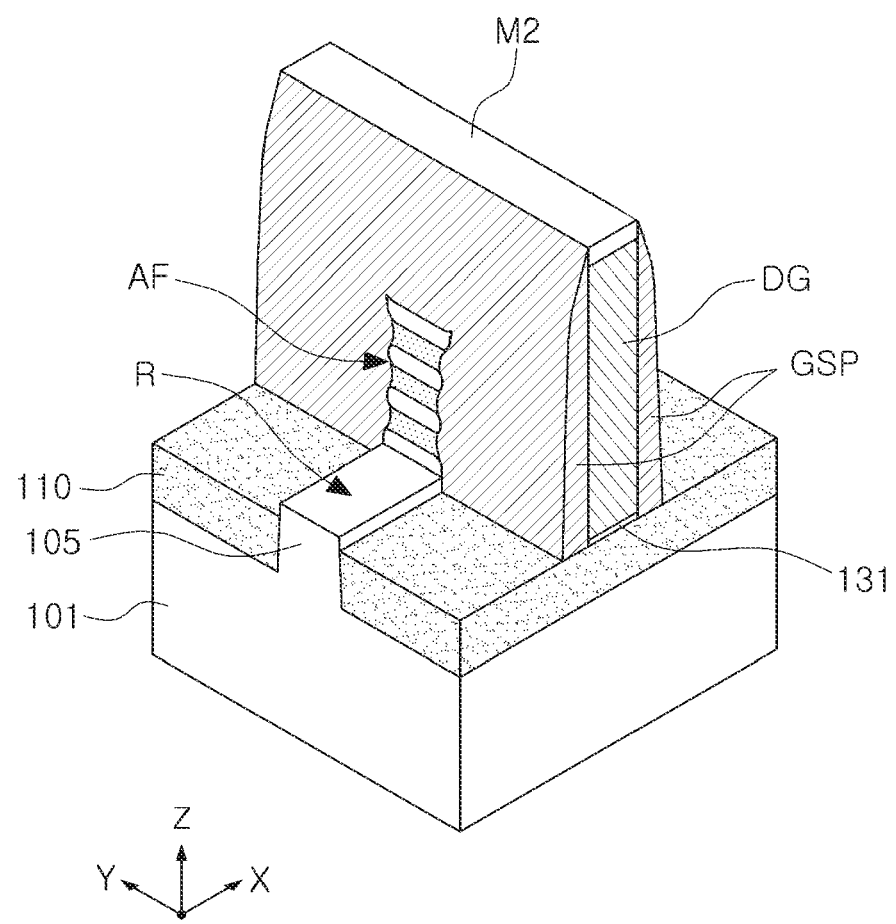

Next, referring to FIG. 12C, a recess R is formed on the fin-type active region 105 by removing regions of the fin-shaped structure AF exposed on both sides of the dummy gate electrode DG and the gate spacer GSP.

After the recess R is formed, a portion of the fin-type active region 105 in contact with the substrate 101 may remain, and may be provided as a lowermost channel region. The alternately stacked first semiconductor layers 151 and second semiconductor layers 152 may be exposed through the side surface of the recess R. In some embodiments, a selective etching process for forming an inner spacer may be additionally performed (see FIGS. 17A and 17B).

Figure 12D:
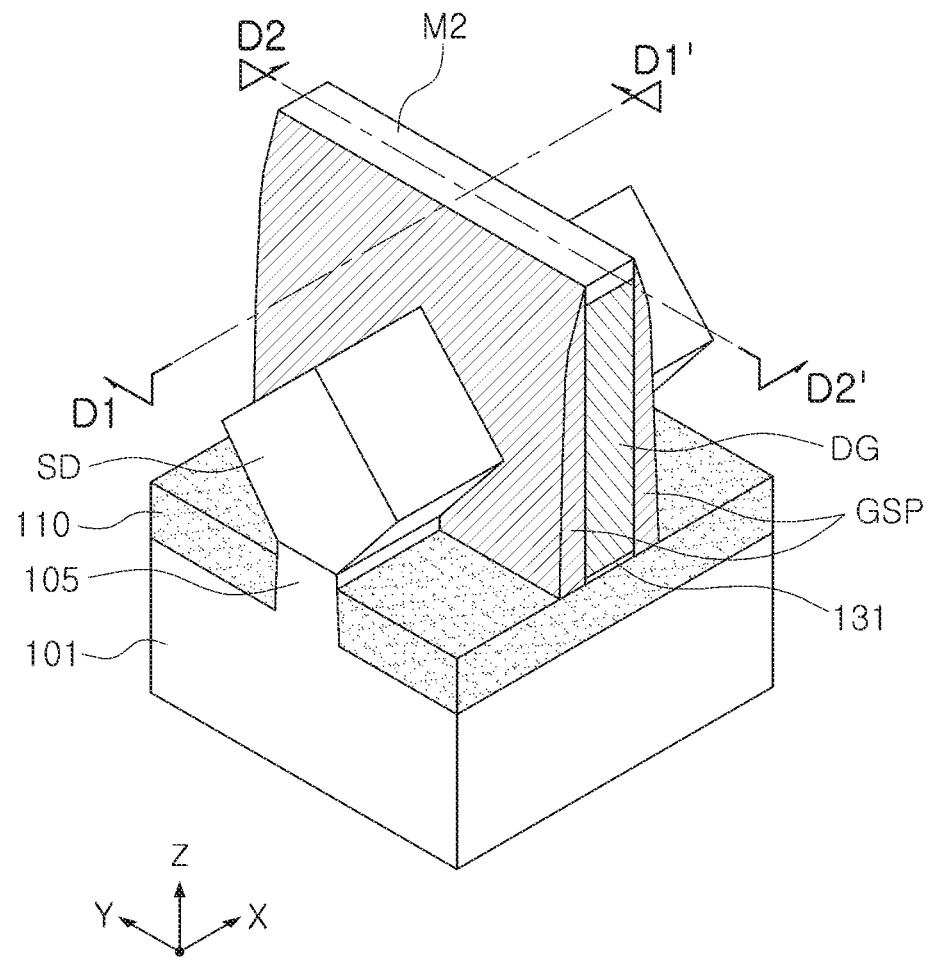

Next, referring to FIG. 12D, the source/drain regions SD may be formed by performing a selective epitaxial regrowth process on the surface exposed by the recess R.

The epitaxial structures grown on both sides of the dummy gate electrode DG may be provided as source/drain regions SD. The regrowth epitaxial layer may be grown from the semiconductor surface exposed on the bottom surface of the recess R and the first semiconductor layers 151 and the second semiconductor layers 152 exposed on the side surface of the recess R. As a result, the source/drain regions SD may share a similar crystalline structure and/or orientation to the first semiconductor layers 151 and/or the second semiconductor layers 152. For example, the crystal structures of the source/drain regions SD, the first semiconductor layers 151 and/or the second semiconductor layers 152 may include the same crystalline structure and/or orientation within tolerances due to lattice mismatch and/or the production of real, non-ideal materials. The source/drain regions SD may have various shapes defined as crystallographically stable surfaces during a growth process. For example, the source/drain regions SD may have a pentagonal cross section. On the other hand, when the source/drain regions SD include silicon (Si) and/or silicon carbide (SiC) doped with n-type impurities, the cross section of the source/drain regions SD may have a hexagonal shape and/or a polygon having a gentle angle.

FIGS. 13A and 13B are cross-sectional views of a portion illustrated in FIG. 12D, taken along lines D1-D1' and D2-D2'.

Referring to FIGS. 13A and 13B, the source/drain regions SD may contact side surfaces of the fin-shaped structure AF disposed below the dummy gate electrode DG and the gate spacer GSP, for example, the first semiconductor layers 151 and the second semiconductor layers 152.

Next, a process of forming the gate structure GS by replacing the dummy gate electrode DG with a real gate electrode may be performed. FIGS. 14A to 16B are cross-sectional views respectively illustrating a process of forming a gate structure in a method of fabricating a semiconductor device according to some example embodiments.

Referring to FIGS. 14A and 14B, an interlayer insulating film 123 is formed on the substrate 101 to cover the source/drain regions SD, the dummy gate electrode DG, and the gate spacer GSP, and subsequently, the interlayer insulating film 123 is planarized until the dummy gate electrode DG is exposed.

In this planarization process, the second mask pattern M2 may be removed. The interlayer insulating film 123 may include at least one of a low dielectric constant material (e.g., a material with a dielectric constant lower than $SiO_2$), an oxide layer, a nitride layer, and an oxynitride layer. Examples of the low dielectric constant material include, for example, silicone dielectrics (e.g., Flowable Oxide (FOx)), polysilazane (e.g., Tonen® SilaZen (TOSZ)), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, and/or combinations thereof.

Subsequently, referring to FIGS. 15A and 15B, the dummy gate electrode DG may be removed through the exposed area, and the etch stop layer 131 may be selectively removed.

By this process, an open region H may be formed between the gate spacers GSP. Side surfaces of the first semiconductor layers 151 and the second semiconductor layers 152 of the fin-shaped structure AF may be exposed in the second direction (e.g., the Y direction) through the open region H.

The first semiconductor layer 151 may be removed using an etchant having a higher etch rate for the second semiconductor layers 152 than for the first semiconductor layers 151. A plurality of spaces H respectively corresponding to the first semiconductor layers 151 may be formed. As a result, the second semiconductor layers 152 may be provided as a plurality of channel layers by being connected to the source/drain regions SD in the first direction (e.g., the X direction). The width and shape of the second semiconductor layers 152 may have unique characteristics described in FIG. 10B.

Next, referring to FIGS. 16A and 16B, a gate insulating film GI may be formed along the peripheries of the second semiconductor layers 152, sidewalls of the gate spacer GSP, and the exposed source/drain regions SD.

The gate insulating film GI may be conformally formed, and the formation thereof may be performed by another insulating film forming process. Subsequently, the gate electrode GE may be formed on the gate insulating film GI to extend in the second direction (e.g., the Y direction), and may be formed in a space between the gate spacers GI, a space between the channel layers CH, and a space between the channel layer CH and the fin-type active region 105. Accordingly, a required gate structure GS may be formed.

Figures 17A, 17B:
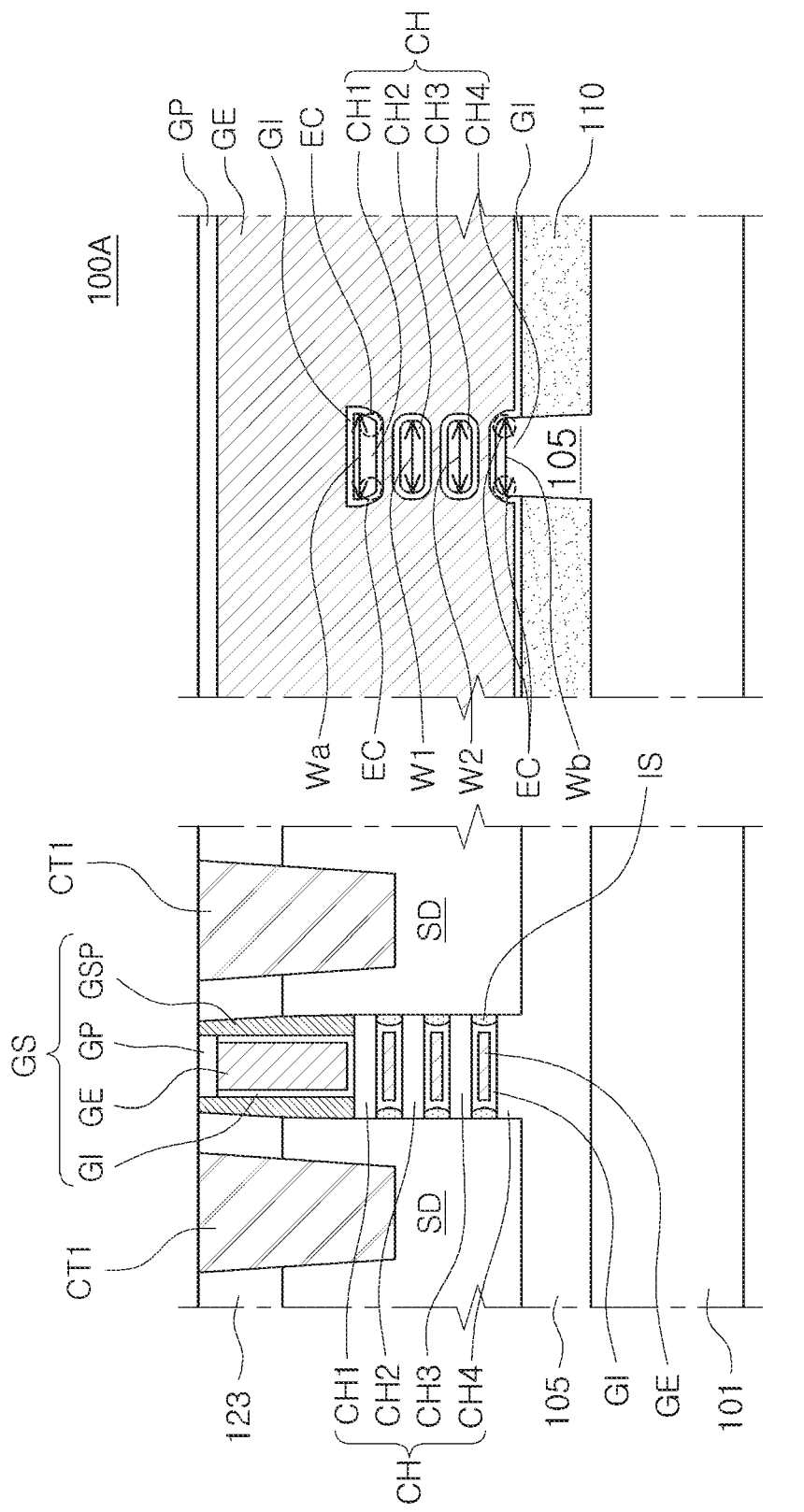
FIGS. 17A and 17B are cross-sectional views of a semiconductor device according to some example embodiments, taken along lines D1-D1' and D2-D2'.

FIGS. 17A and 17B are cross-sectional views taken along lines D1-D1' and D2-D2' of a semiconductor device according to another example embodiment.

A semiconductor device 100A according to an example embodiment may be understood as being similar to the semiconductor device 100 illustrated in FIG. 2, except that an internal spacer IS included and the shape of the first channel layer CH1, which is the uppermost channel layer, is different. In addition, the components of the present embodiment may be understood with reference to the description of the same or similar components of the semiconductor device 100 illustrated in FIG. 2 unless otherwise specified.

Although the first channel layer CH1 of the semiconductor device 100 employed in the previous example embodiments has protruding portions ("PT" in FIGS. 2 and 3) on both sides of the upper surface thereof, the first channel layer CH1 of the semiconductor device 100A employed in this example embodiment may have a relatively flat surface. As described in FIGS. 5 and 6, the protruding portion ("PT" in FIGS. 2 and 3) is a mask structure, for example, a structure provided by partial etching of the buffer oxide layer, and therefore, depending on the mask formation process and the mask material, the over-etched portion may not be generated, and in this case, as illustrated in FIG. 17B, the upper surface of the first channel layer CH1 may not have a protruding portion. Alternatively, in another example embodiment, when the over-etched portion of the buffer oxide layer is relatively large, the protrusion structure may have a relatively large size.

As illustrated in FIG. 17A, the semiconductor device 100A may include internal spacers IS provided between the source/drain regions SD and the gate electrode GE. The internal spacers IS may be provided on one side of the gate electrode GE. The internal spacers IS and the channel layers CH may be alternately disposed in a direction perpendicular to the upper surface of the substrate 101. The source/drain region SD may contact the channel layer CH, and may be spaced apart from the gate electrode GE with the internal spacers IS interposed therebetween. The gate insulating film GI may be interposed between the gate electrode GE and each of the channel layers 104, and may extend between the gate electrode GE and each of the internal spacers IS. Each of the internal spacers IS may contact the gate insulating film GI.

After forming the recess (see FIG. 12C) and before forming the source/drain regions SD (see FIG. 12D), portions of side surfaces of the first semiconductor layers 151 in the first direction (e.g., the X direction) may be selectively etched, and internal spacers IS may be formed by filling the etched space with an insulating material. For example, the internal spacers IS may include SiN, SiCN, SiON, SiBN, SiOCN, SiBCN and/or SiOC.

Figure 18:
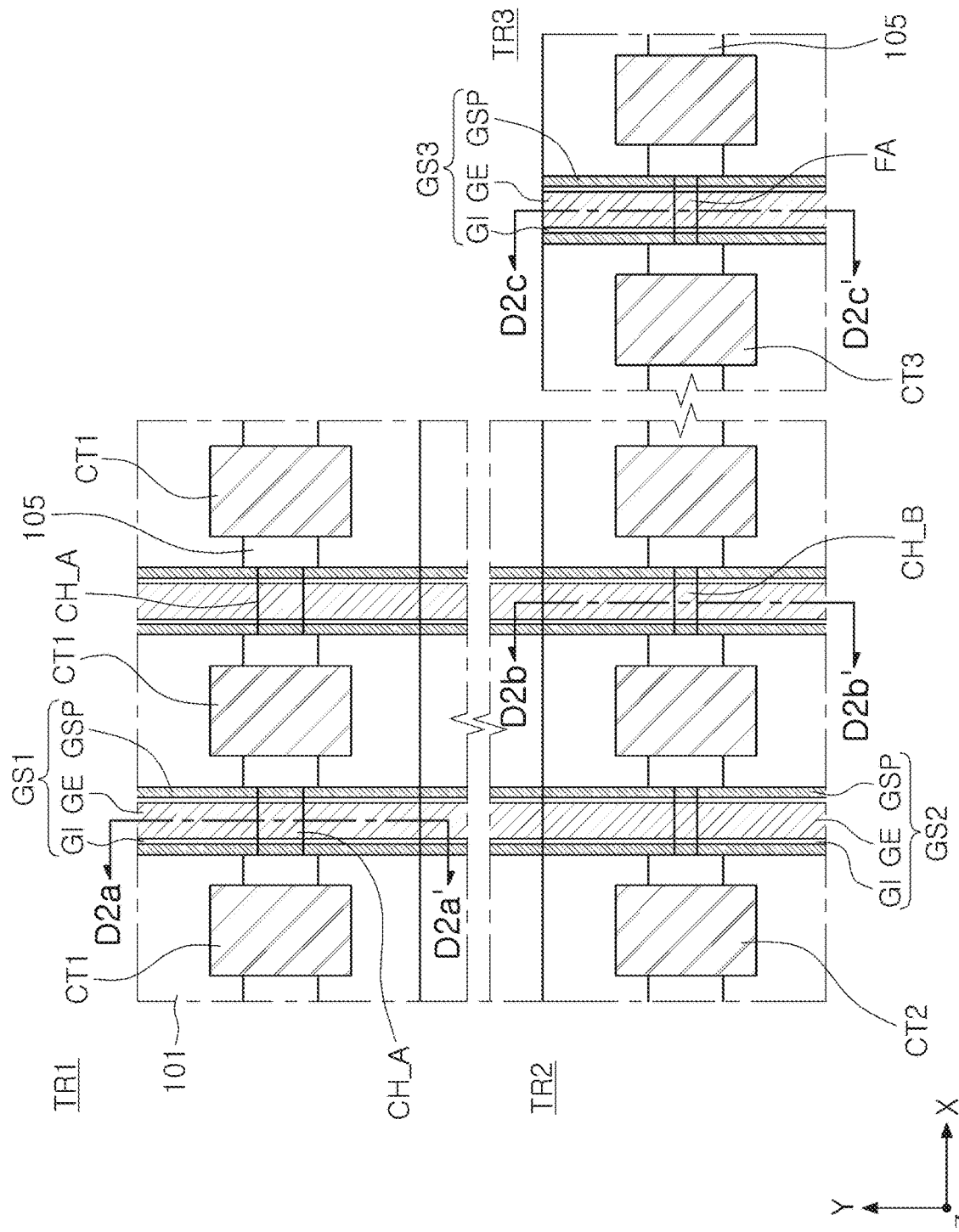
FIG. 18 is a plan view illustrating a semiconductor device according to some example embodiments.
Figure 19A:
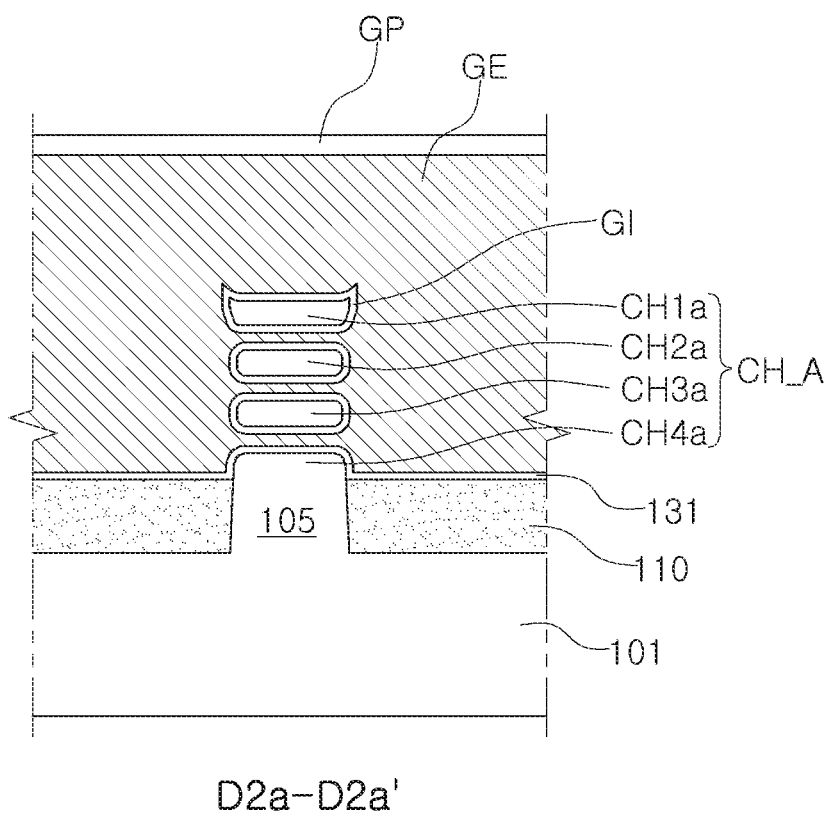
FIGS. 19A to 19C are cross-sectional views of the semiconductor device illustrated in FIG. 18, taken along lines D2a-D2a', D2b-D2b', and D2c-D2c'.
Figure 19B:
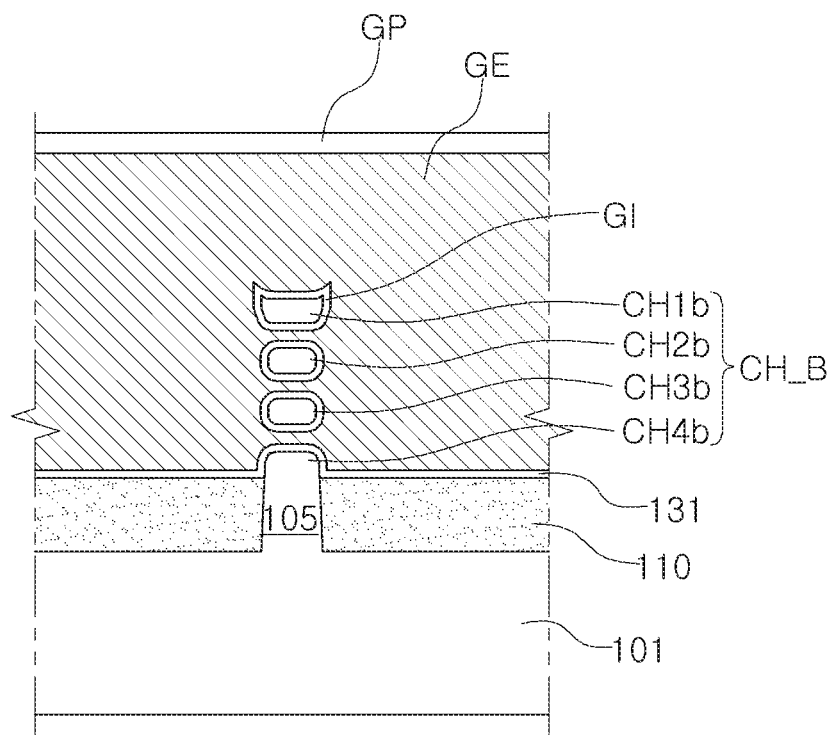
Figure 19C:
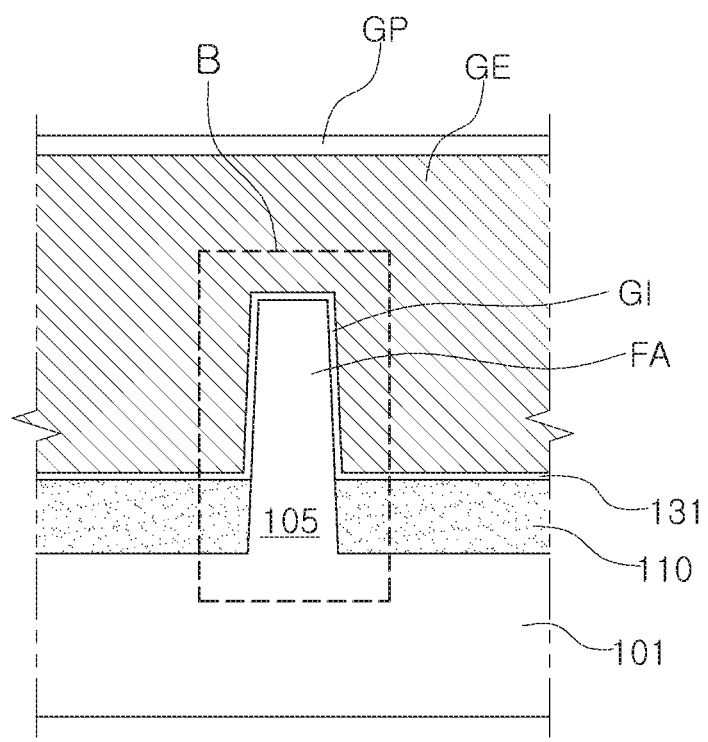

FIG. 18 is a plan view illustrating a semiconductor device according to some example embodiments, and FIGS. 19A to 19C are cross-sectional views illustrating the semiconductor device of FIG. 18, taken along lines D2a-D2a', D2b-D2b', and D2c-D2c'.

Referring to FIGS. 19A and 19B together with FIG. 18, first and second transistors TR1 and TR2 are provided in a first region (I) of the substrate 101, and the first region (I) of the substrate 101 may be a memory cell area in which a plurality of memory cells are formed and/or a logic cell area in which logic transistors are disposed. For example, the first and second transistors TR1 and TR2 may be portions of a memory cell transistor constituting a plurality of SRAM cells and/or of logic transistors constituting a processor core.

Referring to FIGS. 18 and 19C, third transistors TR3 are provided in a second region (II) of the substrate 101, and the second region (II) of the substrate 101 may be a peripheral circuit area constituting a power supply circuit or the like. In some embodiments, the third transistor TR3 comprises an input/output device, for example, and may be configured to operate at a higher voltage than the first and second transistors TR.

First, referring to FIGS. 19A and 19B, the first and second transistors TR1 and TR2 are illustrated as transistors of different conductivity types formed in different conductivity type wells W1 and W2. For example, the first transistor TR1 may be a P-MOSFET formed in the n-type well W1, and the second transistor TR2 may be an N-MOSFET formed in the p-type well W2, and/or the inverse. However, the example embodiments are not limited thereto, but in another embodiment, the first and second transistors TR1 and TR2 may include the same conductivity type transistors formed in the same conductivity type well.

As illustrated in FIGS. 19A and 19B, respective channel layers CH_A and CH_B of the first and second transistors may have different widths. For example, the channel layer CH_A of the first transistor TR1 may have a width greater than that of the channel layer CH_B of the second transistor TR2. In this case, even when the first and second transistors TR1 and TR2 have different widths, in the introduction of the silicon epitaxial liner and the annealing process for forming the device isolation layer, as described above, the width and shape of each channel layer may have specific characteristics thereof.

For example, in the first transistor TR1, first and fourth channel layers CH1a and CH4a may have widths greater than that of second channel layers CH2a and CH3a disposed therebetween, and also, similarly in the second transistor TR2, first and fourth channel layers CH1b and CH4b have widths greater than the widths of second channel layers CH2b and CH3b disposed therebetween. In addition, the first channel layers CH1a and CH1b of the first and second transistors TR1 and TR2 may have portions protruding upwardly on both edges of the upper surfaces, and may have downwardly inclined side surfaces. Similarly, the fourth channel layers CH4a and CH4b of the first and second transistors TR1 and TR2 may have upwardly inclined side surfaces. On the other hand, both side end surfaces of the second and third channel layers CH3a, CH3b, CH4a, and CH4b may have a convex shape.

The first and second source/drain regions SD1 and SD2 may be epitaxial layers regrown from the channel layers CH_A and CH_B on the bottom and side surfaces of the fin-type active region 105. When the first transistor TR1 is a P-MOSFET, the first source/drain regions SD1 may include a material that provides compressive strain to the channel layers CH_A. For example, the first source/drain regions SD1 may include a SiGe layer having a lattice constant greater than that of Si. The first source/drain regions SD1 may have a P-type impurity region. Inversely, when the second transistor TR2 is an N-MOSFET, the second source/drain regions SD2 may include a semiconductor material that provides stretchable strain to the channel layers CH_B. For example, the second source/drain regions SD2 may include a SiC layer having a lattice constant smaller than that of Si, or a Si layer having substantially the same lattice constant as the substrate 101. The second source/drain regions SD2 may have an N-type impurity region.

Figure 20A:
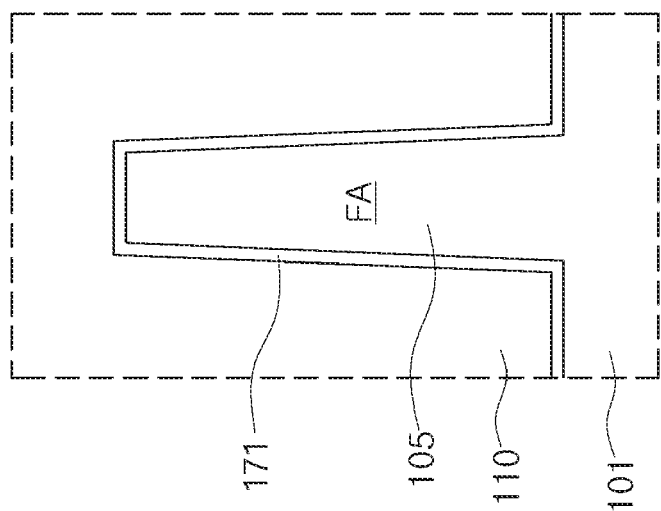
FIGS. 20A to 20C are cross-sectional views illustrating some processes of the method of manufacturing the semiconductor device illustrated in FIG. 19C.
Figure 20B:
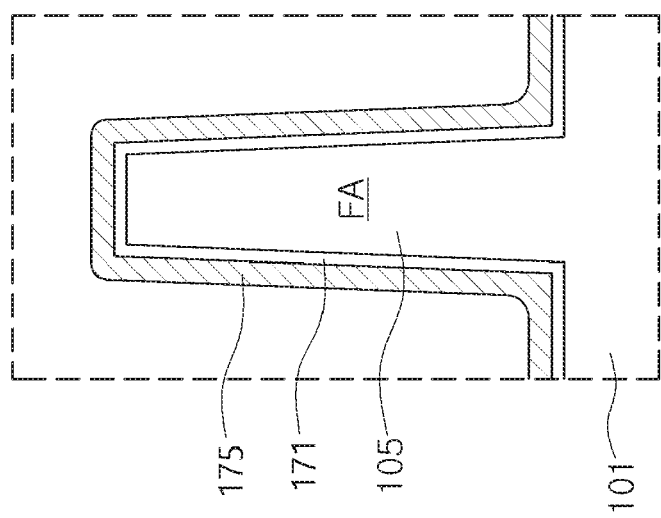
Figure 20C:
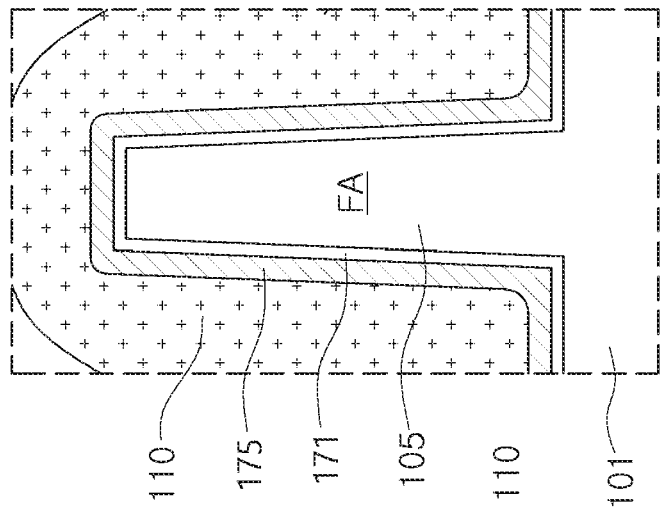

Referring to FIG. 19C, as described above, the third transistors TR3 may constitute a peripheral circuit such as an input/output device, and may employ a channel structure having a single active fin FA instead of a stacked channel structure using multi-nanosheets. FIGS. 20A to 20C are cross-sectional views illustrating some processes of the method of fabricating the semiconductor device illustrated in FIG. 19C.

First, referring to FIG. 20A, an insulating film 171 may be formed on the surface of the active fin FA. The insulating film 171 may include an amorphous material and/or an oxide. For example, a section of a substrate 101 may be etched so that a fin structure is formed, the fin structure may correspond to the active fin FA and/or the active region 105. The etching process forming the active fin FA may be the same or a different etching process illustrated in FIGS. 5A and 5B. After the formation of the fin structure the insulating film 171 may be deposited on the substrate layer. Next, referring to FIG. 20B, a liner 175 including polysilicon and/or amorphous silicon is formed on the insulating film 171. This liner forming process may be performed together with the silicon epitaxial liner process illustrated in FIGS. 6A and 6B. In the process of forming the silicon epitaxial liner 160 described in FIGS. 6A and 6B, a liner 175 formed of polysilicon or amorphous silicon, not silicon epitaxial, may be formed on the amorphous insulating film 171 in the second region. Next, referring to FIG. 20C, subsequent processes such as a gap-fill insulating film 110 and a device isolation layer forming process such as an annealing process may be performed on the liner 175.

As set forth above, according to some example embodiments, a semiconductor device having a channel having a three-dimensional structure, with improved electrical characteristics and reliability, may be provided.

While some example embodiments have been illustrated and described above, it will be apparent to those skilled in the art that modifications and variations could be made without departing from the scope of the present inventive concepts as defined by the appended claims.

What is claimed is:

1. A method of fabricating a semiconductor device, comprising:
forming a stack structure by alternately stacking a plurality of first semiconductor layers and a plurality of second semiconductor layers on an active region of a substrate;
forming a fin-shaped structure on the active region by partially etching the stack structure, the fin-shaped structure extending in a first direction parallel to an upper surface of the substrate;
forming a silicon epitaxial liner on a surface of the fin-shaped structure;
forming a gap-fill insulating film on the silicon epitaxial liner to surround the fin-shaped structure;
applying an annealing process to the gap-fill insulating film; and
partially removing the gap-fill insulating film to expose the fin-shaped structure.

2. The method of claim 1, further comprising:
applying a nitriding treatment process using plasma to the silicon epitaxial liner between the forming of the silicon epitaxial liner and the forming of the gap-fill insulating film.

3. The method of claim 1, further comprising:
repeating the forming of the gap-fill insulating film and the applying the annealing process, prior to the partially removing of the gap-fill insulating film.

4. The method of claim 1, wherein the forming of the fin-shaped structure includes:
sequentially forming a buffer oxide layer and a mask layer on a region corresponding to the fin-shaped structure, and
etching the stack structure using the mask layer such that the buffer oxide layer is partially etched to expose an edge region of an upper surface of the fin-shaped structure.

5. The method of claim 4, wherein in the forming of the silicon epitaxial liner, a silicon epitaxial portion is formed on the edge region of the upper surface of the fin-shaped structure.

6. The method of claim 1, wherein the forming of the silicon epitaxial liner is performed in a range of 300° C. to 700° C.

7. The method of claim 1, wherein the annealing process is a wet annealing process.

8. The method of claim 1, wherein a thickness of the silicon epitaxial liner increases after the annealing process.

9. The method of claim 1, wherein widths of the plurality of first semiconductor layers are reduced to be less than widths of the plurality of second semiconductor layers in the annealing process.

10. The method of claim 1, wherein the plurality of second semiconductor layers includes an uppermost semiconductor layer, a lowermost semiconductor layer, and an intermediate semiconductor layer between the uppermost semiconductor layer and the lowermost semiconductor layer, and
wherein after the annealing process, the uppermost semiconductor layer has a width greater than a width of the intermediate semiconductor layer in a cross section taken in a second direction, the second direction parallel to the upper surface of the substrate and intersecting the first direction.

11. The method of claim 10, wherein after the annealing process, the width of the intermediate semiconductor layer is less than a width of the lowermost semiconductor layer in the cross section taken in the second direction.

12. The method of claim 10, wherein after the annealing process, the uppermost semiconductor layer has downwardly inclined side surfaces in the cross section taken in the second direction.

13. The method of claim 10, wherein after the annealing process, the lowermost semiconductor layer has upwardly inclined side surfaces in the cross section taken in the second direction.

14. The method of claim 10, wherein after the annealing process both side surfaces of the intermediate semiconductor layer have a convex shape in the cross section taken in the second direction.

15. The method of claim 1, wherein each of the plurality of first semiconductor layers includes SiGe, and each of the plurality of second semiconductor layers includes Si.

16. A method of fabricating a semiconductor device, comprising:
  forming a stack structure by alternately stacking a plurality of first semiconductor layers and a plurality of second semiconductor layers on an active region of a substrate;
  forming a fin-shaped structure on the active region by partially etching the stack structure, the fin-shaped structure extending in a first direction parallel to an upper surface of the substrate;
  forming a silicon epitaxial liner on a surface of the fin-shaped structure;
  forming a gap-fill insulating film on the silicon epitaxial liner to surround the fin-shaped structure;
  applying an annealing process to the gap-fill insulating film;
  partially removing the gap-fill insulating film to expose the fin-shaped structure;
  forming a dummy gate electrode extending in a second direction on the fin-shaped structure, the second direction parallel to the upper surface of the substrate and intersecting the first direction;
  forming gate spacers on both sidewalls of the dummy gate electrode;
  forming a recess in a portion of the fin-shaped structure on at least one side of the dummy gate electrode;
  forming a source/drain region in the recess of the fin-shaped structure;
  removing the dummy gate electrode between the gate spacers;
  selectively removing the plurality of first semiconductor layers from the fin-shaped structure; and
  sequentially forming a gate insulating film and a gate electrode between the gate spacers to surrounding each of the plurality of second semiconductor layers in the second direction.

17. The method of claim 16, wherein the plurality of second semiconductor layers includes an uppermost semiconductor layer, a lowermost semiconductor layer, and an intermediate semiconductor layer between the uppermost semiconductor layer and the lowermost semiconductor layer, and
  wherein, after the annealing process, the intermediate semiconductor layer has a width less than a width of the lowermost semiconductor layer in the second direction.

18. The method of claim 17, wherein after the annealing process, the width of the intermediate semiconductor layer is less than a width of the uppermost semiconductor layer in a cross section taken in the second direction.

19. The method of claim 18, wherein after the annealing process, a difference in the width of the intermediate semiconductor layer and the width of the uppermost semiconductor layer is in a range of 1 nm to 10 nm in the cross section taken in the second direction.

20. A method of fabricating a semiconductor device, comprising:
  forming a stack structure by alternately stacking a plurality of first semiconductor layers and a plurality of second semiconductor layers on an active region of a substrate;
  sequentially forming a mask pattern on the stack structure, the mask pattern extending in a first direction parallel to an upper surface of the substrate;
  etching the stack structure using the mask pattern to form a fin-shaped structure extending in the first direction on the active region;
  conformally forming a silicon epitaxial liner on a surface of the fin-shaped structure;
  forming a gap-fill insulating film on the silicon epitaxial liner to surround the fin-shaped structure;
  applying an annealing process to the gap-fill insulating film;
  repeating the forming of the gap-fill insulating film and the applying the annealing process at least once; and
  partially removing the gap-fill insulating film to expose the fin-shaped structure.

* * * * *